(12) United States Patent
Matsuo et al.

(10) Patent No.: US 10,275,006 B2
(45) Date of Patent: Apr. 30, 2019

(54) INFORMATION PROCESSING DEVICE, POWER ESTIMATION PROGRAM AND POWER ESTIMATION METHOD

(71) Applicant: FUJITSU LIMITED, Kawasaki-shi, Kanagawa (JP)

(72) Inventors: Miyuki Matsuo, Yokohama (JP); Kohta Nakashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 80 days.

(21) Appl. No.: 15/196,534

(22) Filed: Jun. 29, 2016

(65) Prior Publication Data

US 2017/0031414 A1 Feb. 2, 2017

(30) Foreign Application Priority Data

Jul. 27, 2015 (JP) ................. 2015-147538

(51) Int. Cl.
*G05F 1/66* (2006.01)
*G06F 1/28* (2006.01)
(Continued)

(52) U.S. Cl.
CPC ............. *G06F 1/3203* (2013.01); *G06F 1/28* (2013.01); *H04L 67/303* (2013.01); *G01R 21/00* (2013.01); *G01R 21/133* (2013.01); *G01R 31/327* (2013.01); *G05F 1/66* (2013.01); *G06F 1/3206* (2013.01); *G06F 1/3234* (2013.01); *G06F 1/3287* (2013.01); *H02J 3/14* (2013.01); *H02J 3/383* (2013.01); *H02J 13/0017* (2013.01)

(58) Field of Classification Search
CPC .... G01R 21/00; G01R 21/133; G01R 31/327; G05F 1/66; H02J 13/0017; H02J 3/14; H02J 3/383; G06F 1/3203; G06F 1/3206; G06F 1/3234; G06F 1/3287
See application file for complete search history.

(56) References Cited

U.S. PATENT DOCUMENTS

2005/0155021 A1 7/2005 Dewitt et al.
2007/0198864 A1 8/2007 Takase
(Continued)

FOREIGN PATENT DOCUMENTS

JP 2007-249961 A 9/2007
JP 2010-191937 9/2010
(Continued)

OTHER PUBLICATIONS

U.S. Office Action dated Apr. 11, 2018 for copending U.S. Appl. No. 15/383,349, 17 pages.
(Continued)

*Primary Examiner* — Terrell S Johnson
(74) *Attorney, Agent, or Firm* — Fujitsu Patent Center

(57) ABSTRACT

An information processing device includes a memory to store a power consumption amount for each first time interval output at each first time interval and an occurrence time of a first event which occurs during the first time interval, and a power estimation processor configured to calculate a power consumption amount in the event of an occurrence of the first event, on the basis of the power consumption amount for each first time interval output at each first time interval, and the occurrence time of the first event.

9 Claims, 29 Drawing Sheets

(51) Int. Cl.

| | | |
|---|---|---|
| *G06F 1/32* | (2006.01) | |
| *H02J 3/14* | (2006.01) | |
| *H02J 3/38* | (2006.01) | |
| *G01R 21/00* | (2006.01) | |
| *H02J 13/00* | (2006.01) | |
| *H04L 29/08* | (2006.01) | |
| *G01R 21/133* | (2006.01) | |
| *G01R 31/327* | (2006.01) | |
| *G06F 1/3203* | (2019.01) | |
| *G06F 1/3234* | (2019.01) | |
| *G06F 1/3206* | (2019.01) | |
| *G06F 1/3287* | (2019.01) | |

(56) References Cited

U.S. PATENT DOCUMENTS

| | | |
|---|---|---|
| 2008/0133180 A1 | 6/2008 | Floyd et al. |
| 2008/0140993 A1 | 6/2008 | Bhargava et al. |
| 2010/0058079 A1 | 3/2010 | Yamamoto et al. |
| 2012/0124560 A1 | 5/2012 | Indukuru et al. |
| 2013/0117596 A1 | 5/2013 | Furukawa |
| 2013/0124885 A1 | 5/2013 | Davis et al. |
| 2014/0075417 A1 | 3/2014 | Holmberg |
| 2014/0380069 A1* | 12/2014 | Berke .................. G06F 1/32 713/320 |
| 2015/0046143 A1* | 2/2015 | Huang ................ G06F 17/5036 703/21 |
| 2015/0160274 A1* | 6/2015 | Obara .................. G01R 21/133 702/61 |
| 2015/0261287 A1 | 9/2015 | Ishihara |
| 2017/0269678 A1* | 9/2017 | Matsuo ................. G06F 1/3228 |

FOREIGN PATENT DOCUMENTS

| | | |
|---|---|---|
| JP | 2012-039375 | 2/2012 |
| JP | 2013-238425 | 11/2013 |
| JP | 2014-153180 | 8/2014 |
| JP | 2015-175630 A | 10/2015 |

OTHER PUBLICATIONS

Bellosa, Frank, "The Benefits of Event-Driven Energy Accounting in Power-Sensitive Systems", In Proceedings of The 9th Workshop on ACM SIGOPS European Workshop: Beyond the PC: New Challenges for the Operating System (EW 9). ACM, New York, NY, USA, Department of Computer Science (Operating Systems), University of Erlangen, Martensstr. 1, 91058 Erlangen, Germany, 2000, pp. 37-42.

Japanese Office Action dated Jan. 15, 2019 for corresponding Japanese Patent Application No. 2015-147538, with English Translation, 5 pages.

\* cited by examiner

FIG. 3

SPECIFIC EXAMPLE OF THE SAMPLING INFORMATION 131

| INFORMATION ID | PROCESS ID | INSTRUCTION ADDRESS | POWER VALUE (J) | TIME |
|---|---|---|---|---|
| 1 | 12980 | 0x0040460 | 2 | 10:10:00.000000 |
| 2 | 12980 | 0x0040500 | 5 | 10:10:00.000100 |
| 3 | 12980 | 0x0040820 | 1 | 10:10:00.000200 |
| 4 | 17320 | 0x0021920 | 2 | 10:10:00.000300 |
| 5 | 17320 | 0x0021360 | 6 | 10:10:00.000400 |

FIG. 11

SPECIFIC EXAMPLE OF THE SAMPLING INFORMATION 131

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 0 | 10:10:00.000020 |
| 3 | 12980 | 0x0040820 | 8 | 0 | 10:10:00.000040 |
| 4 | 12980 | 0x0040940 | 8 | 0 | 10:10:00.000060 |
| 5 | 12980 | 0x0040380 | 8 | 0 | 10:10:00.000080 |
| 6 | 12980 | 0x0040520 | 23 | 0 | 10:10:00.000100 |
| 7 | 12980 | 0x0040840 | 23 | 0 | 10:10:00.000120 |
| 8 | 17320 | 0x0021920 | 23 | 0 | 10:10:00.000140 |
| 9 | 17320 | 0x0021360 | 23 | 0 | 10:10:00.000160 |
| 10 | 17320 | 0x0021640 | 28 | 0 | 10:10:00.000180 |
| 11 | 17320 | 0x0021720 | 28 | 0 | 10:10:00.000200 |
| 12 | 17320 | 0x0021480 | 28 | 0 | 10:10:00.000220 |
| 13 | 17320 | 0x0021320 | 28 | 0 | 10:10:00.000240 |

FIG. 12

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |

FIG. 13

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 0 | 10:10:00.000020 |
| 3 | 12980 | 0x0040820 | 8 | 0 | 10:10:00.000040 |
| 4 | 12980 | 0x0040940 | 8 | 0 | 10:10:00.000060 |
| 5 | 12980 | 0x0040380 | 8 | 0 | 10:10:00.000080 |
| 6 | 12980 | 0x0040520 | 23 | 0 | 10:10:00.000100 |

FIG. 14

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 0 | 10:10:00.000040 |
| 4 | 12980 | 0x0040940 | 8 | 0 | 10:10:00.000060 |
| 5 | 12980 | 0x0040380 | 8 | 0 | 10:10:00.000080 |
| 6 | 12980 | 0x0040520 | 23 | 0 | 10:10:00.000100 |

FIG. 15

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 3 | 10:10:00.000040 |
| 4 | 12980 | 0x0040940 | 8 | 3 | 10:10:00.000060 |
| 5 | 12980 | 0x0040380 | 8 | 3 | 10:10:00.000080 |
| 6 | 12980 | 0x0040520 | 23 | 3 | 10:10:00.000100 |

FIG. 16

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 3 | 10:10:00.000040 |
| 4 | 12980 | 0x0040940 | 8 | 3 | 10:10:00.000060 |
| 5 | 12980 | 0x0040380 | 8 | 3 | 10:10:00.000080 |
| 6 | 12980 | 0x0040520 | 23 | 3 | 10:10:00.000100 |
| 7 | 12980 | 0x0040840 | 23 | 0 | 10:10:00.000120 |
| 8 | 17320 | 0x0021920 | 23 | 0 | 10:10:00.000140 |
| 9 | 17320 | 0x0021360 | 23 | 0 | 10:10:00.000160 |
| 10 | 17320 | 0x0021640 | 23 | 0 | 10:10:00.000180 |
| 11 | 17320 | 0x0021720 | 28 | 0 | 10:10:00.000200 |

FIG. 17

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 3 | 10:10:00.000040 |
| 4 | 12980 | 0x0040940 | 8 | 3 | 10:10:00.000060 |
| 5 | 12980 | 0x0040380 | 8 | 3 | 10:10:00.000080 |
| 6 | 12980 | 0x0040520 | 23 | 3 | 10:10:00.000100 |
| 7 | 12980 | 0x0040840 | 23 | 1 | 10:10:00.000120 |
| 8 | 17320 | 0x0021920 | 23 | 1 | 10:10:00.000140 |
| 9 | 17320 | 0x0021360 | 23 | 1 | 10:10:00.000160 |
| 10 | 17320 | 0x0021640 | 23 | 1 | 10:10:00.000180 |
| 11 | 17320 | 0x0021720 | 28 | 1 | 10:10:00.000200 |

FIG. 19

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 2 | 10:10:00.000020 |
| 3 | 12980 | 0x0040820 | 8 | 3 | 10:10:00.000040 |
| 4 | 12980 | 0x0040940 | 8 | 3 | 10:10:00.000060 |
| 5 | 12980 | 0x0040380 | 8 | 3 | 10:10:00.000080 |
| 6 | 12980 | 0x0040520 | 23 | 0 | 10:10:00.000100 |
| 7 | 12980 | 0x0040840 | 23 | 0 | 10:10:00.000120 |
| 8 | 17320 | 0x0021920 | 23 | 0 | 10:10:00.000140 |
| 9 | 17320 | 0x0021360 | 23 | 0 | 10:10:00.000160 |
| 10 | 17320 | 0x0021640 | 23 | 0 | 10:10:00.000180 |
| 11 | 17320 | 0x0021720 | 28 | 0 | 10:10:00.000200 |

FIG. 20

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 2 | 10:10:00.000020 |
| 3 | 12980 | 0x0040820 | 8 | 2 | 10:10:00.000040 |
| 4 | 12980 | 0x0040940 | 8 | 2 | 10:10:00.000060 |
| 5 | 12980 | 0x0040380 | 8 | 2 | 10:10:00.000080 |
| 6 | 12980 | 0x0040520 | 23 | 2 | 10:10:00.000100 |
| 7 | 12980 | 0x0040840 | 23 | 2 | 10:10:00.000120 |
| 8 | 17320 | 0x0021920 | 23 | 2 | 10:10:00.000140 |
| 9 | 17320 | 0x0021360 | 23 | 2 | 10:10:00.000160 |
| 10 | 17320 | 0x0021640 | 23 | 2 | 10:10:00.000180 |
| 11 | 17320 | 0x0021720 | 28 | 2 | 10:10:00.000200 |

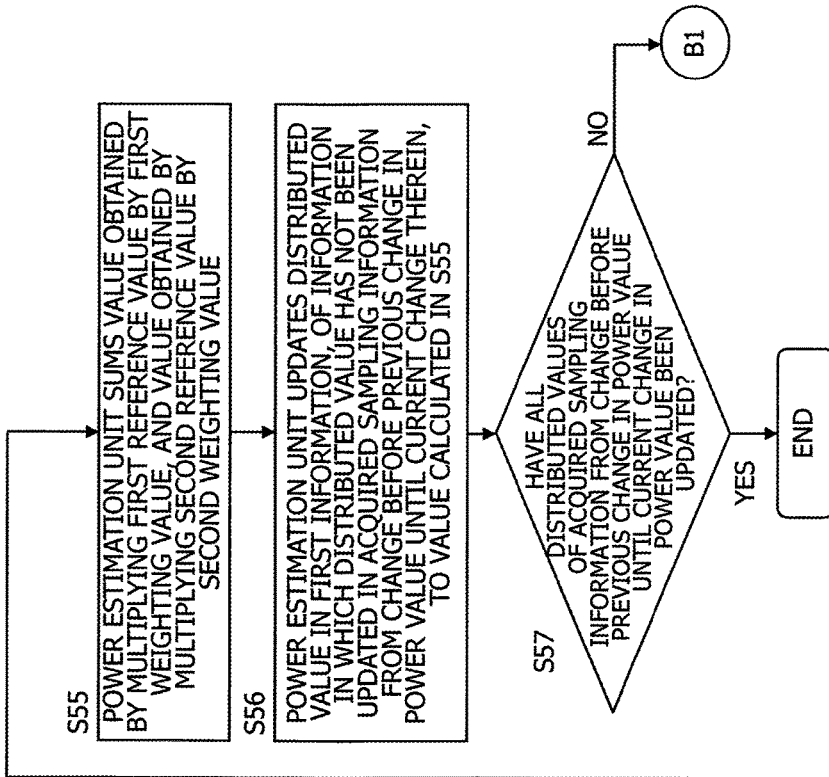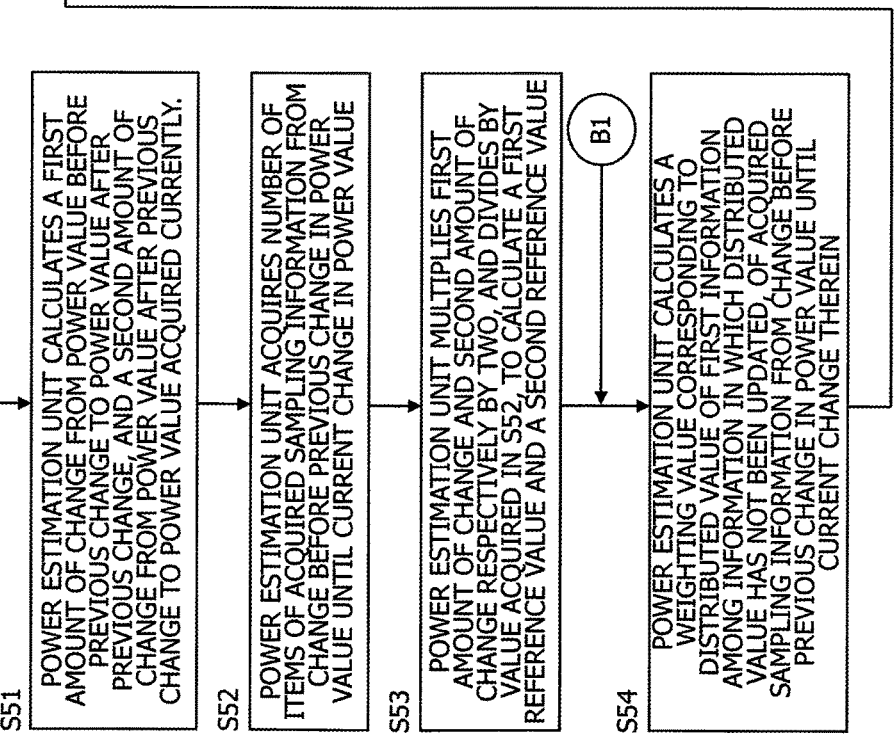
FIG. 21

FIG. 22

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
| --- | --- | --- | --- | --- | --- |
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 3 | 10:10:00.000040 |
| 4 | 12980 | 0x0040940 | 8 | 3 | 10:10:00.000060 |
| 5 | 12980 | 0x0040380 | 8 | 3 | 10:10:00.000080 |
| 6 | 12980 | 0x0040520 | 23 | 3 | 10:10:00.000100 |
| 7 | 12980 | 0x0040840 | 23 | 0 | 10:10:00.000120 |
| 8 | 17320 | 0x0021920 | 23 | 0 | 10:10:00.000140 |
| 9 | 17320 | 0x0021360 | 23 | 0 | 10:10:00.000160 |
| 10 | 17320 | 0x0021640 | 23 | 0 | 10:10:00.000180 |
| 11 | 17320 | 0x0021720 | 28 | 0 | 10:10:00.000200 |

FIG. 23

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | TIME |
|---|---|---|---|---|---|
| 1 | 12980 | 0x0040460 | 8 | 0 | 10:10:00.000000 |
| 2 | 12980 | 0x0040500 | 8 | 3 | 10:10:00.000020 |
| 3 | 12980 | 0x0040820 | 8 | 2.78 | 10:10:00.000040 |
| 4 | 12980 | 0x0040940 | 8 | 2.56 | 10:10:00.000060 |
| 5 | 12980 | 0x0040380 | 8 | 2.33 | 10:10:00.000080 |
| 6 | 12980 | 0x0040520 | 23 | 2.11 | 10:10:00.000100 |
| 7 | 12980 | 0x0040840 | 23 | 1.89 | 10:10:00.000120 |
| 8 | 17320 | 0x0021920 | 23 | 1.67 | 10:10:00.000140 |
| 9 | 17320 | 0x0021360 | 23 | 1.44 | 10:10:00.000160 |
| 10 | 17320 | 0x0021640 | 23 | 1.22 | 10:10:00.000180 |
| 11 | 17320 | 0x0021720 | 28 | 1 | 10:10:00.000200 |

FIG. 27

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | POWER DISTRIBUTED INDEX VALUE | TIME |
|---|---|---|---|---|---|---|
| 1 | 12980 | 0x0040460 | 8 | 0 | 200 | 10:10:00.000000 |
| 2 | 12980 | 0x0040500 | 8 | 0 | 100 | 10:10:00.000020 |
| 3 | 12980 | 0x0040820 | 8 | 0 | 400 | 10:10:00.000040 |
| 4 | 12980 | 0x0040940 | 8 | 0 | 200 | 10:10:00.000060 |
| 5 | 12980 | 0x0040380 | 8 | 0 | 100 | 10:10:00.000080 |
| 6 | 12980 | 0x0040520 | 23 | 0 | 200 | 10:10:00.000100 |

FIG. 28

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | POWER DISTRIBUTED INDEX VALUE | TIME |
|---|---|---|---|---|---|---|
| 1 | 12980 | 0x0040460 | 8 | 0 | 200 | 10:10:00.000000 |
| 2 | 12980 | 0x0040500 | 8 | 1.5 | 100 | 10:10:00.000020 |
| 3 | 12980 | 0x0040820 | 8 | 0 | 400 | 10:10:00.000040 |
| 4 | 12980 | 0x0040940 | 8 | 0 | 200 | 10:10:00.000060 |
| 5 | 12980 | 0x0040380 | 8 | 0 | 100 | 10:10:00.000080 |
| 6 | 12980 | 0x0040520 | 23 | 0 | 200 | 10:10:00.000100 |

FIG. 29

SPECIFIC EXAMPLE OF THE ACQUIRED SAMPLING INFORMATION 132

| INFORMATION ID | PROCESS ID | INSTRUCTION ADDRESS | POWER VALUE (J) | DISTRIBUTED VALUE (J) | POWER DISTRIBUTED INDEX VALUE | TIME |
|---|---|---|---|---|---|---|
| 1 | 12980 | 0x00040460 | 8 | 0 | 200 | 10:10:00.000000 |
| 2 | 12980 | 0x00040500 | 8 | 1.5 | 100 | 10:10:00.000020 |
| 3 | 12980 | 0x00040820 | 8 | 6 | 400 | 10:10:00.000040 |
| 4 | 12980 | 0x00040940 | 8 | 3 | 200 | 10:10:00.000060 |
| 5 | 12980 | 0x00040380 | 8 | 1.5 | 100 | 10:10:00.000080 |
| 6 | 12980 | 0x00040520 | 23 | 3 | 200 | 10:10:00.000100 |

INFORMATION PROCESSING DEVICE, POWER ESTIMATION PROGRAM AND POWER ESTIMATION METHOD

CROSS-REFERENCE TO RELATED APPLICATION

This application is based upon and claims the benefit of priority of the prior Japanese Patent Application No. 2015-147538, filed on Jul. 27, 2015, the entire contents of which are incorporated herein by reference.

FIELD

The present invention relates to an information processing device, a power estimation program and a power estimation method.

BACKGROUND

For example, in a business system which is operating, an proprietor who is providing services to a user (simply called "proprietor" below) makes a power profile in respect of programs which are operating on the business system and/or programs which are scheduled to operate on the business system.

A power profile is an analysis of the characteristics of the power consumption amount when the program is executed. The proprietor, by making a power profile, is able to acquire the power consumption amount for each function which is included in the program (also called "analysis object program" below). Consequently, the proprietor is thereby able to identify functions with a large power consumption amount, from among the functions included in the analysis object program, as locations which ought to be modified in order to improve performance. (See, for example Japanese Laid-open Patent Publication No. 2010-191937, Japanese Laid-open Patent Publication No. 2012-039375, and Japanese Laid-open Patent Publication No. 2013-238425.)

SUMMARY

When making a power profile as described above, the proprietor acquires the power consumption amount of a central computing unit (CPU) associated with the execution of the analysis object program using, for instance, a power measurement device (for example, an external power measurement device). The proprietor then compares the acquired power consumption amount with the execution history information for respective functions included in the analysis object program (also called "trace information" below). The proprietor can thereby acquire the power consumption amount for each function included in the analysis object program.

However, in this case, the proprietor has to provide a power measurement device in order to make a power profile. Furthermore, depending on the amount of trace information, the processing burden involved in comparing the trace information and the power consumption amount may become huge.

On the other hand, when making a power profile as described above, the proprietor may use a power measurement function already provided in the CPU. In this case, for example, the proprietor acquires and mutually associates, at prescribed time intervals apart, the power consumption amount measured by the power measurement function and information about the function that is being processed in the CPU. Consequently, the proprietor is able to make a power profile without requiring a power measurement device as described above.

However, there may be functions included in the analysis object program which have a shorter processing time than the measurement interval of the power consumption amount by the power measurement function. Therefore, the proprietor is not able to make a power profile of high accuracy in respect of functions for which processing is completed in a shorter time than the measurement interval of the power consumption amount by the power measurement function.

According to an aspect of the embodiments an information processing device includes a memory to store a power consumption amount for each first time interval output at each first time interval and an occurrence time of a first event which occurs during the first time interval, and a power estimation processor configured to calculate a power consumption amount in the event of an occurrence of the first event, on the basis of the power consumption amount for each first time interval output at each first time interval, and the occurrence time of the first event.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 2 to 4 are diagrams illustrating a specific example of the processing of the information acquisition unit 121.

FIG. 11 is a diagram illustrating a specific example of the sampling information 131.

FIG. 12 is a diagram illustrating a specific example of the acquired sampling information 132 after carrying out the process in S23.

FIGS. 13 to 15 are diagrams illustrating the acquired sampling information 132 in a case where the process in S23 has been carried out six times.

FIGS. 16 and 17 are diagrams illustrating the acquired sampling information 132 in a case where the process in S23 has been carried out eleven times.

FIGS. 19 and 20 are diagrams illustrating the acquired sampling information 132 in a case where the process in S23 has been carried out eleven times.

FIG. 21 is a flowchart for describing an estimation process according to the third embodiment.

FIGS. 22 and 23 are diagrams illustrating the acquired sampling information 132 in a case where the process in S23 has been carried out eleven times.

FIGS. 27 to 29 are diagrams illustrating the acquired sampling information 132 in a case where the process in S23 has been carried out six times.

DESCRIPTION OF EMBODIMENTS

Configuration of Information Processing Device

Figure 1:
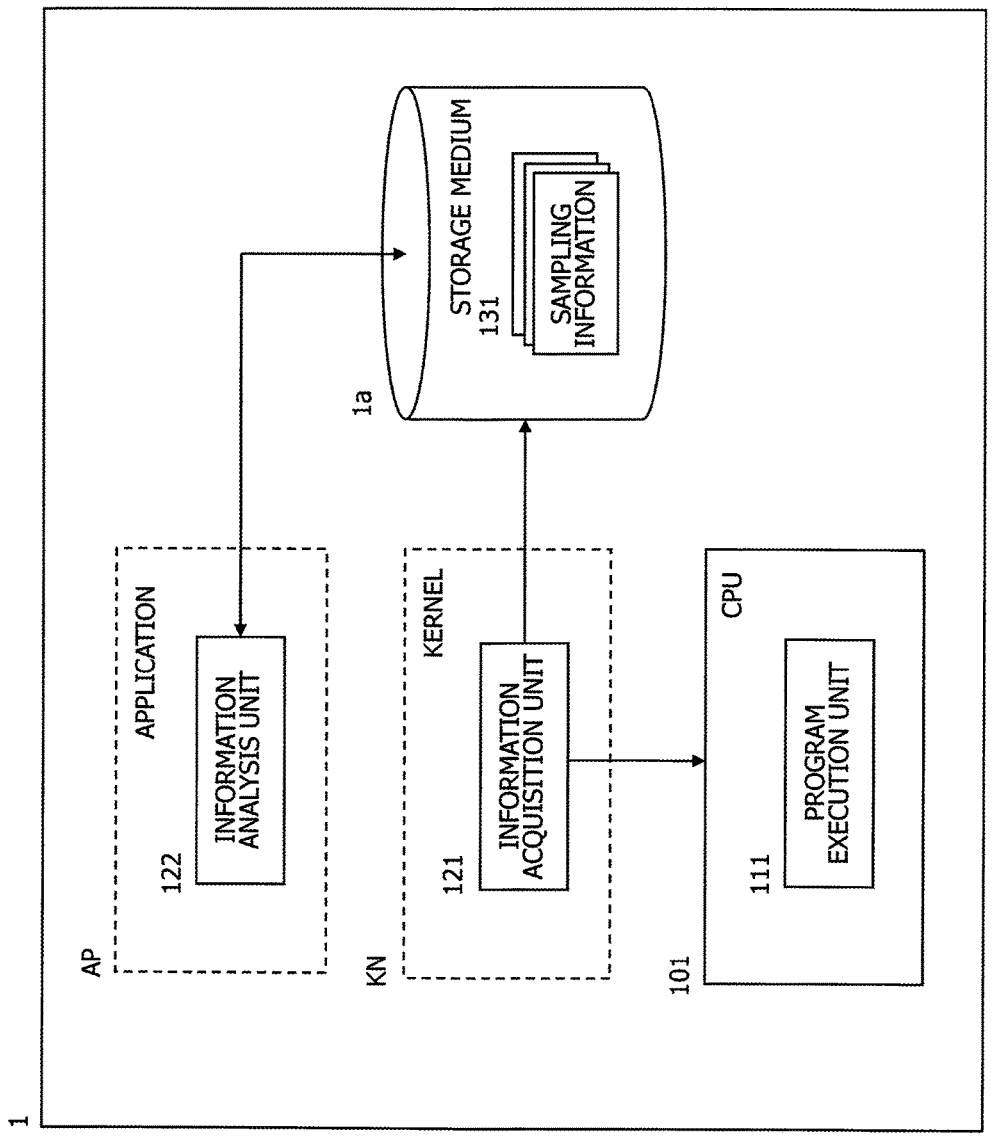
FIG. 1 is a diagram illustrating the general configuration of the information processing device 1.

FIG. 1 is a diagram illustrating the general configuration of the information processing device 1. The information processing device 1 illustrated in FIG. 1 (called "computer 1" below) includes a CPU 101 and a storage medium 1a.

The information processing device 1 illustrated in FIG. 1 makes a power profile of an analysis object program being executed by a CPU 101 (a program execution unit 111 which is one portion of the CPU 101). More specifically, in the information processing device 1 illustrated in FIG. 1, an information acquisition unit 121, which is one portion of a kernel KN that is one portion of an Operating System (OS) running on the CPU101, acquires the power consumption amount for each function included in the analysis object program in accordance with execution of the analysis object program by the CPU 101. More specifically, coordinated operation with the program, the CPU 101 operates as the information acquisition unit 121. The information acquisition unit 121 stores the acquired power consumption amount in the storage medium 1a as sampling data 131 (called "sampling information 131" below).

Therefore, in the information processing device 1 illustrated in FIG. 1, an information analysis unit 122, which is one portion of an application AP running on the kernel KN, makes a power profile on the basis of the sampling information 131 stored in the storage medium 1a. More specifically, coordinated operation with the program, the CPU 101 operates as the information analysis unit 122. The information processing device 1 is thereby able to acquire the power consumption amount for each function included in the analysis object program, for the proprietor.

[Specific Example of Processing of Information Acquisition Unit]

Figure 2:
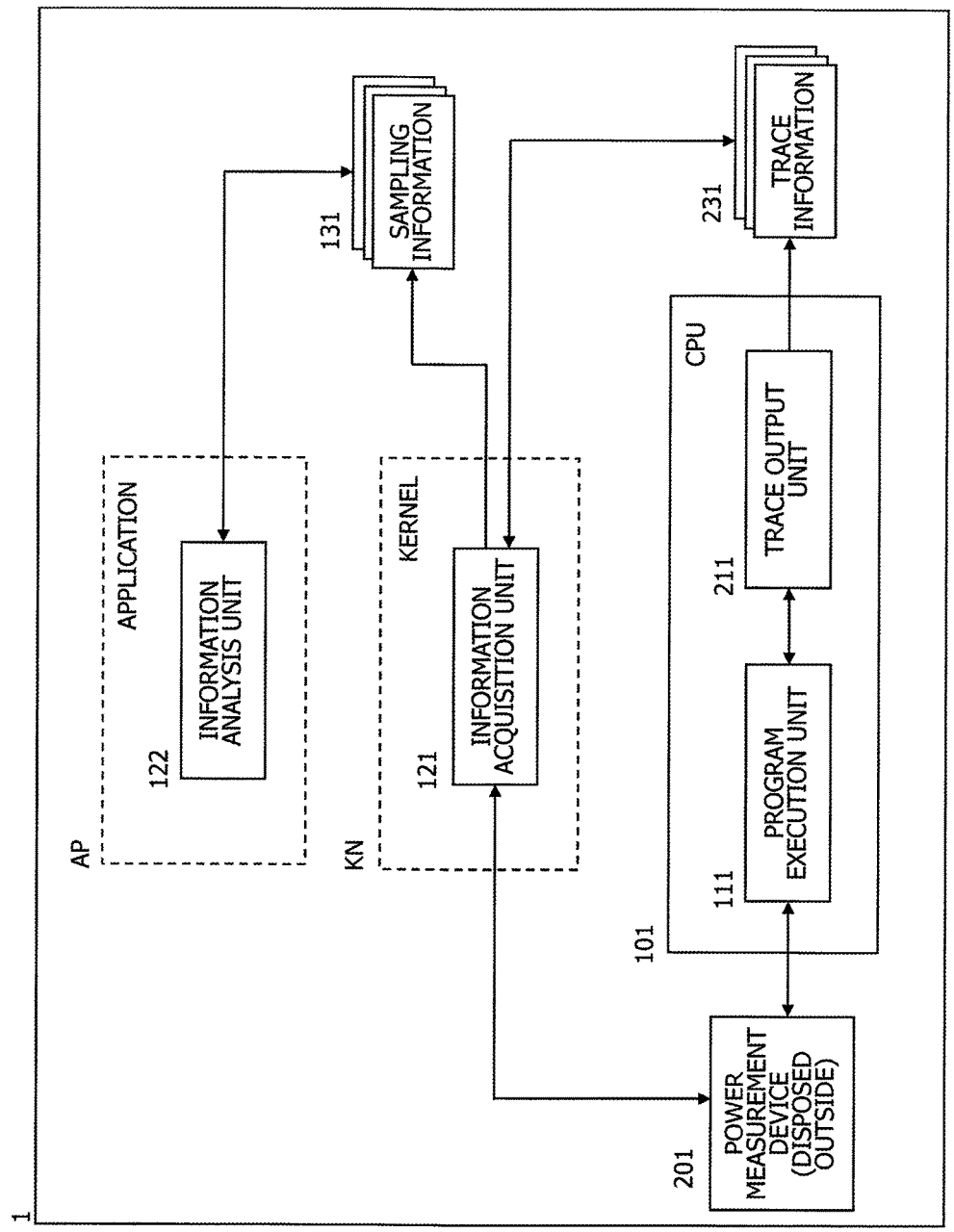
Figure 4:
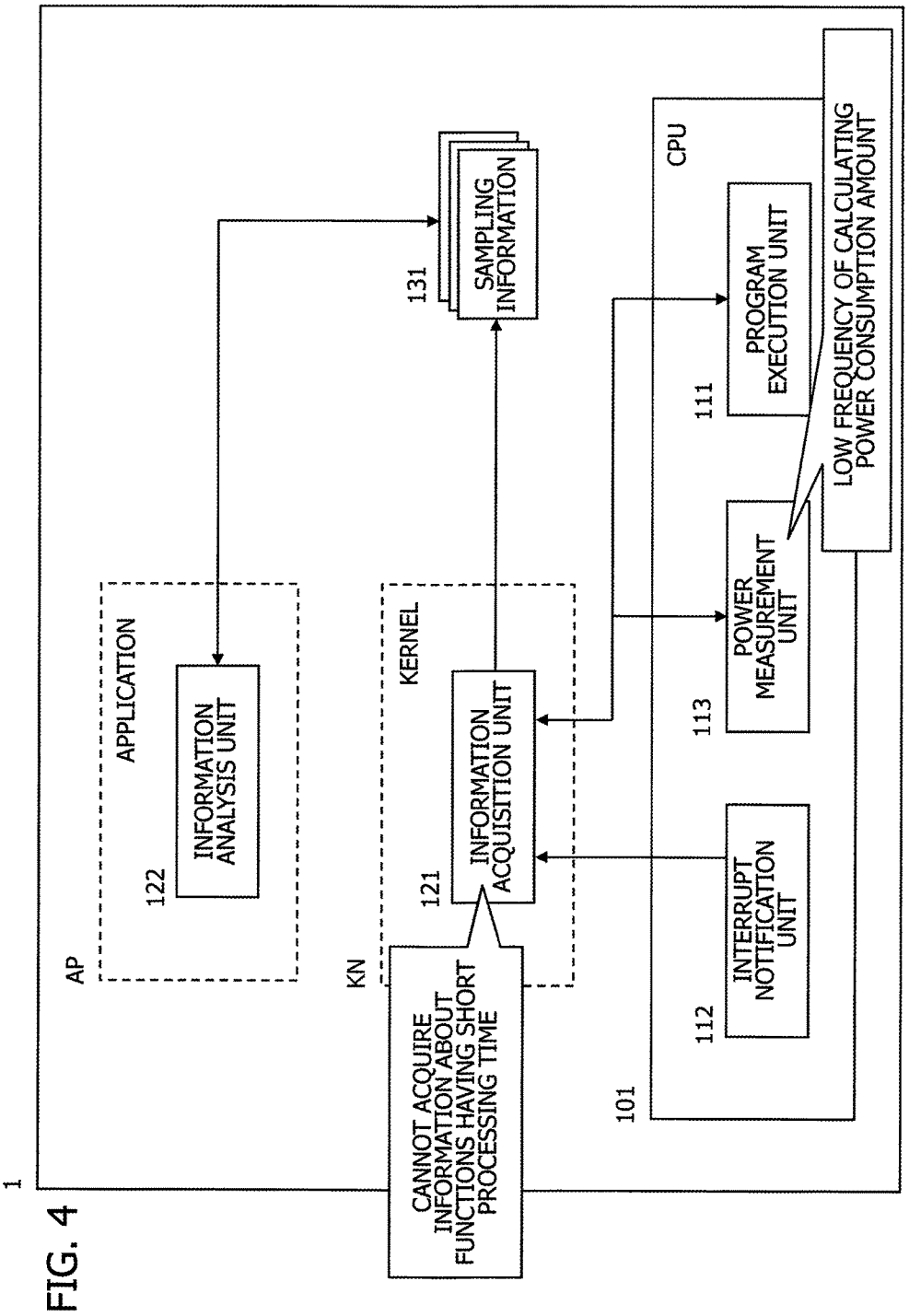

Next, a specific example of the processing of the information acquisition unit 121 will be described. FIGS. 2 to 4 are diagrams illustrating a specific example of the processing of the information acquisition unit 121.

Apart from the program execution unit 111, the CPU 101 illustrated in FIG. 2 has a trace output unit 211 which outputs trace information 231 for acquiring trace information which is execution information of the analysis object program running on the CPU 101. Furthermore, a power measurement device 201 for measuring the power consumption amount of the CPU 101 at the time of executing the analysis object program is provided externally to the CPU 101.

As illustrated in FIG. 2, the information acquisition unit 121 illustrated in FIG. 2 creates sampling information 131 by comparing the power consumption amount acquired by the power measurement device 201, and the trace information 231, when the information analysis unit 122 is making a power profile, for example. Below, a specific example of the sampling information 131 will be explained.

FIG. 3 is a diagram illustrating a specific example of the sampling information 131. The sampling information 131 illustrated in FIG. 3 includes the items: "information ID" which identifies the items of information included in the sampling information 131, and "process ID" which indicates the ID of a process carried out in the CPU 101. Furthermore, the sampling information 131 illustrated in FIG. 3 includes the items: "instruction address" which indicates the storage location of a instruction executed by the CPU 101, "power value" which indicates the power consumption amount in the CPU 101, and "time" which indicates the timing of creation of the respective items of information included in the sampling information 131.

In the sampling information 131 illustrated in FIG. 3, it is possible to identify the respective functions included in the analysis object program by combining the information set in "process ID" and the information set in "instruction address". Furthermore, in the example illustrated in FIG. 3, the unit of information set in the "power value" is Joules (J).

The information set in "process ID" and "instruction address", of the information included in the sampling information 131 illustrated in FIG. 3, is information that was included in the trace information 231. Furthermore, the information set in "power value", of the information included in the sampling information 131 illustrated in FIG. 3, is information acquired from the power measurement device 201.

More specifically, in the information having an "ID" of "1" of the sampling information 131 illustrated in FIG. 3, the "process ID" is set to "12980", the "instruction address" is set to "0x0040460", and the "power value" is set to "2 (J)". Furthermore, in the information having an "ID" of "1" in the sampling information 131 illustrated in FIG. 3, the "time" is set to "10:10:00.000000".

More specifically, the information having an "ID" of "1" indicates that, when the "time" was "10:10:00.000000", a function having a "process ID" of "12980" and a "instruction address" of "0x0040460" was carried out. Furthermore, the information having an "ID" of "1" indicates that the power consumption amount at that time was "2 (J)". The other information included in FIG. 3 is not explained here.

When making a power profile of the analysis object program by the method illustrated in FIG. 2, the operator making the power profile (simply called "operator" below) is required to provide a power measurement device 201 which is disposed outside the CPU 101. When creating the sampling information 131, the operator is required to adjust the timing between the power measurement device 201 and the CPU 101 (information processing device 1).

Furthermore, when making a power profile for an analysis object program by the method illustrated in FIG. 2, the operator is required to compare the power consumption amount acquired by the power measurement device 201 with the trace information 231, in order to create the sampling information 131. Therefore, depending on the amount of information in the trace information 231, the load and time required to create the sampling information 131 becomes large.

On the other hand, when making a power profile as described above, the operator may use a power measurement function provided in the CPU 101. FIG. 4 is a diagram illustrating a specific example of processing of the information acquisition unit 121 when using a CPU 101 having a power measurement function (called "power measurement unit 113" below).

The CPU 101 illustrated in FIG. 4 has an interrupt notification unit 112 (simply called "notification unit 112" below), apart from the program execution unit 111 and the power measurement unit 113. The interrupt notification unit 112 uses a performance monitoring counter (PMC) function of the CPU 101, for example.

In the example illustrated in FIG. 4, the interrupt notification unit 112 issues a notification (interrupt notification) to the information acquisition unit 121 at prescribed time intervals apart (for example, 1 millisecond intervals). The information acquisition unit 121 which receives a notification from the interrupt notification unit 112 acquires execution information (process ID and instruction address) for the analysis object program which is currently being executed by the program execution unit 111, by accessing the program execution unit 111. Moreover, in this case, the information acquisition unit 121 acquires the current power consumption amount of the CPU 101 by accessing the power measurement unit 113. Thereby, the proprietor is able to create sampling information 131 as explained in FIG. 3, without using an external power measurement device 201 as illustrated in FIG. 2.

However, there may be functions included in the program which have a shorter processing time than the measurement interval of the power consumption amount by the power measurement unit 113. In this case, as illustrated in FIG. 4, the proprietor is not able to make a power profile of high accuracy in respect of functions for which processing is completed in a shorter time than the measurement interval of the power consumption amount by the power measurement unit 113.

Therefore, the information processing device 1 according to the present embodiment acquires the power consumption amount for each particular time interval (called "first time interval" below), which is output at each first time interval, and the occurrence timing of an event which occurs during the first time interval (called "first event" below). The information processing device 1 estimates (calculates) the power consumption amount in the event of occurrence of the first event, on the basis of the acquired power consumption amount and the occurrence time of the first event.

In other words, the information processing device 1 according to the present embodiment acquires by estimation the power consumption amount associated with the occurrence of a first event (for example, the execution of a function included in a program), even if the first event is an event which ends within a shorter time than the first time interval. Consequently, the information processing device 1 is able to make a power profile in respect of the first event, regardless of whether or not the first event ends within a shorter time than the first time interval.

[Hardware Configuration of Information Processing Device]

Figure 5:
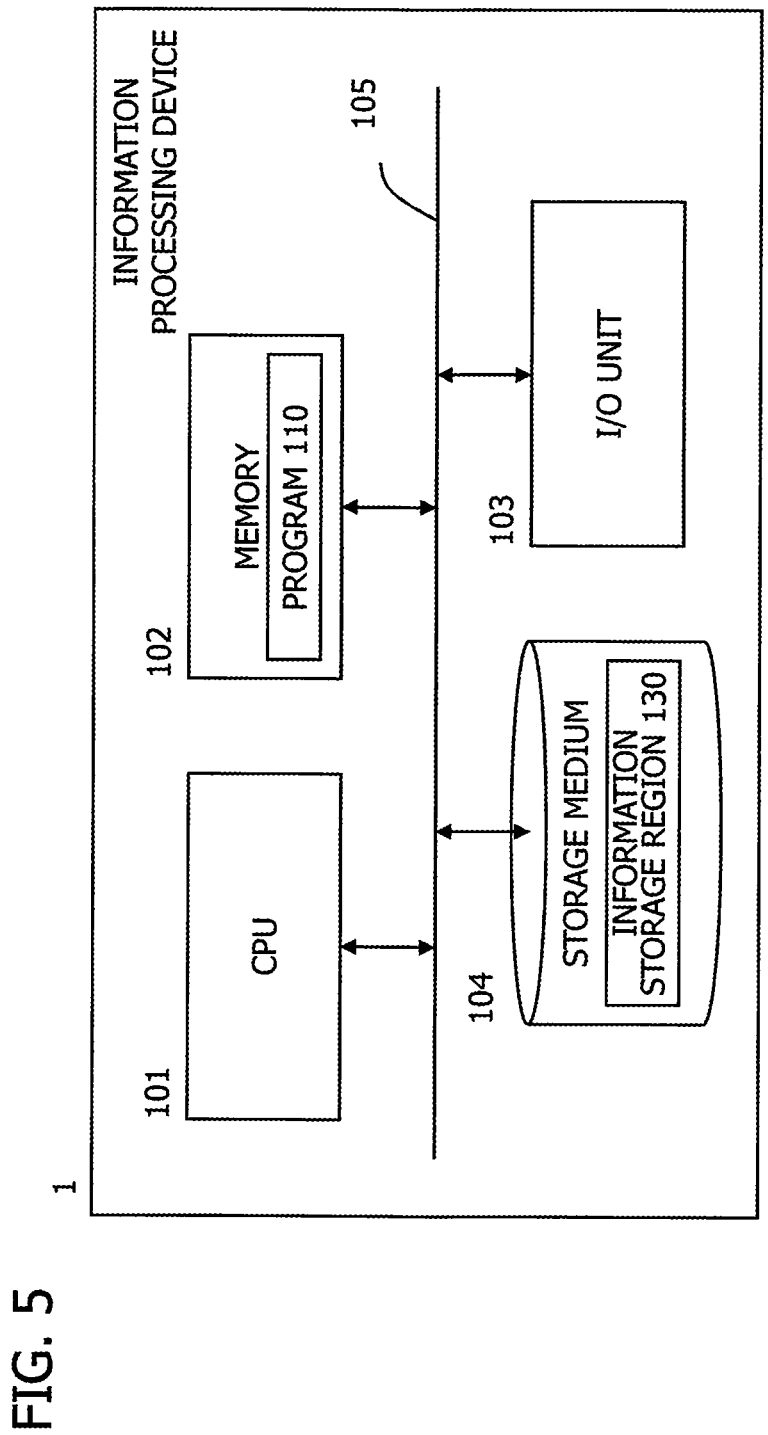
FIG. 5 is a diagram illustrating the hardware configuration of the information processing device 1.

Next, the hardware configuration of the information processing device 1 will be described. FIG. 5 is a diagram illustrating the hardware configuration of the information processing device 1.

The information processing device 1 includes a CPU 101, which is a processor, a memory 102, an external interface (I/O unit) 103, and a storage medium (storage) 104. The units are mutually connected via a bus 105.

The storage medium 104 stores a program 110 (called "estimation program 110" or "power estimation program 110" below) for carrying out a process for estimating the power consumption amount (called "estimation process" or "power estimation process" below), in a program storage region (not illustrated) in the storage medium 104.

As illustrated in FIG. 5, when executing the program 110, the CPU 101 loads the program 110 from the storage medium 104 into the memory 102, and carries out an estimation process in coordination with the program 110.

The storage medium 104, for instance, has an information storage region 130 (called "storage unit 130" below) which stores information used when carrying out the estimation process. Furthermore, the external interface 103 communicates with other information processing devices (for example, a physical machine or virtual machine), for example. The storage medium 1a illustrated in FIG. 1 may correspond to the storage medium 104.

Figure 26:
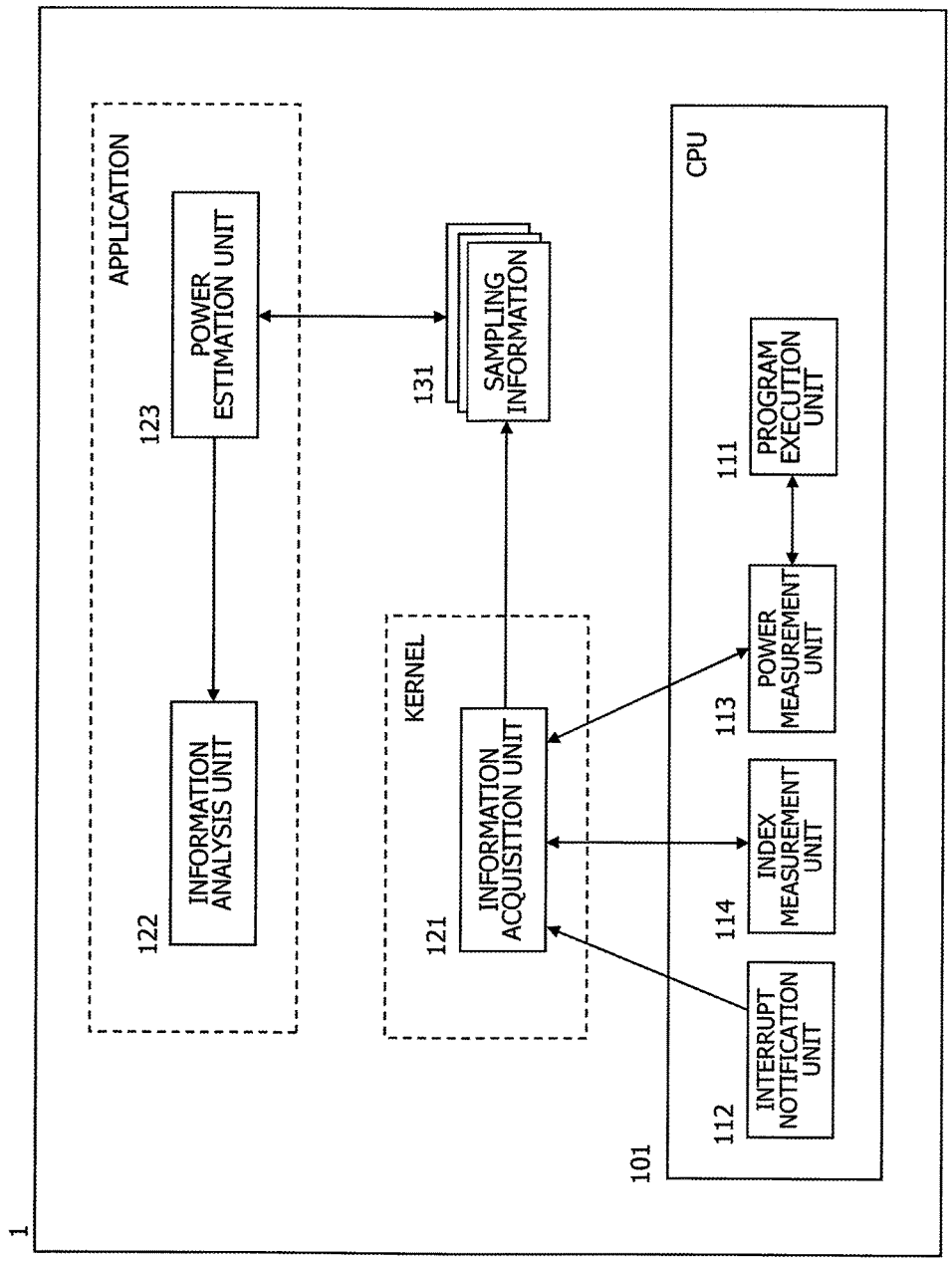
FIG. 26 is a diagram for describing the configuration of an information processing device 1 according to the fourth embodiment.

Next, the functions of the CPU 101 will be explained. The CPU 101 has a program execution unit 111, an interrupt notification unit 112 and a power measurement unit 113, as indicated in FIG. 4, and so on. Furthermore, the CPU 101, for example, has an index measurement unit 114, as illustrated in FIG. 26.

The index measurement unit 114 acquires the number of occurrences of an event (called "second event" below) at each time interval which is shorter than the first time interval (called "second time interval" below). The second event is, for example, a cache miss which occurs in a cache memory (not illustrated) of the CPU 101. The index measurement unit 114, for example, uses the PMC function of the CPU 101, and is thereby able to measure the number of cache misses that have occurred in the cache memory of the CPU 101.

[Software Configuration of Information Processing Device]

Figure 7:
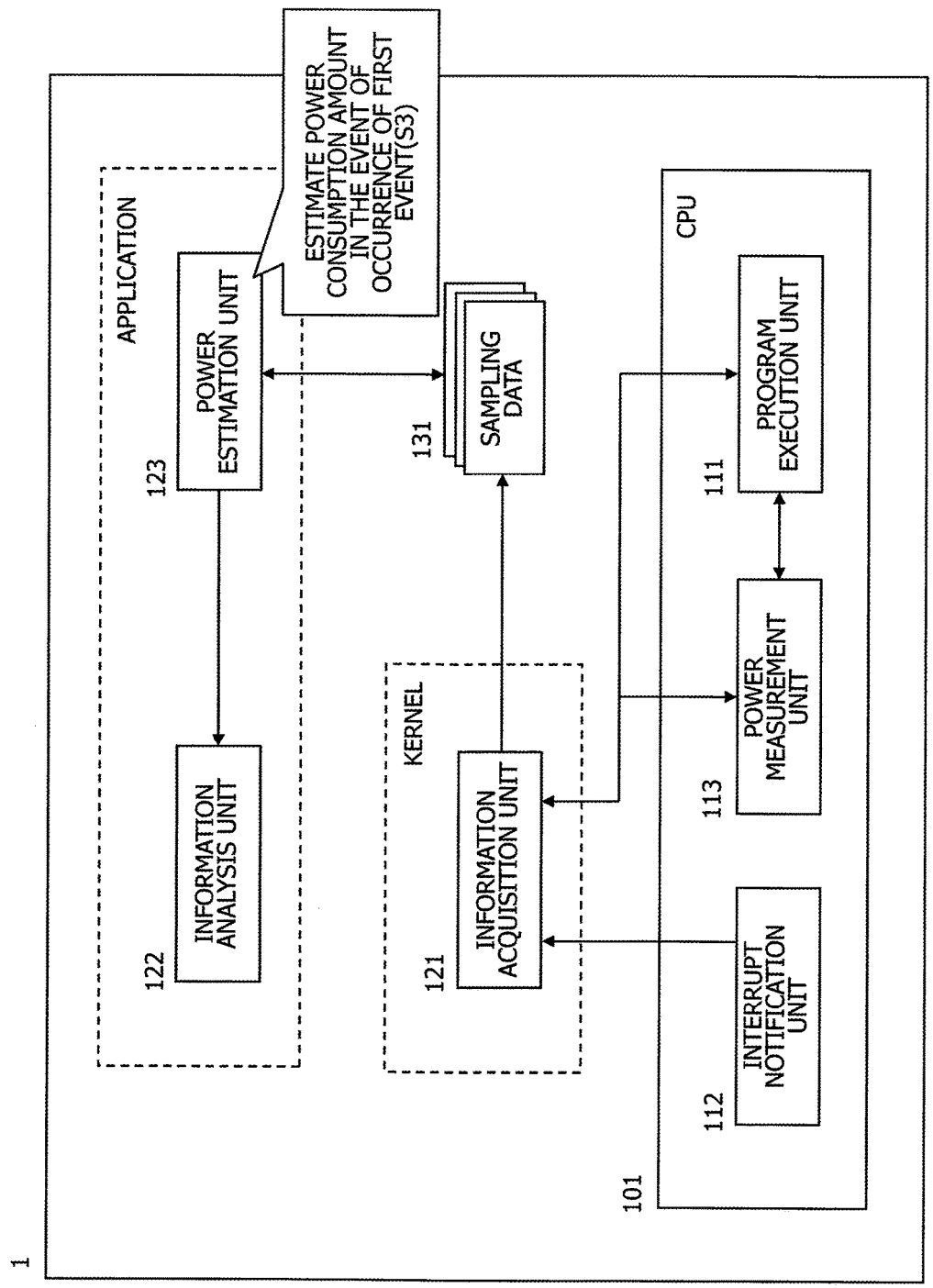
FIG. 7 is a diagram for describing an overview of an estimation process according to the first embodiment.

Next, the software configuration of the information processing device 1 will be described. By coordinated operation with the program 110, the CPU 101 operates as the information acquisition unit 121 and the information analysis unit 122, as illustrated in FIG. 4, etc. Furthermore, the CPU 101, by coordinated operation with the program 110, also operates as the power estimation unit 123, as illustrated in FIG. 7.

The power estimation unit 123 estimates the power consumption amount in the event of the occurrence of the first event, on the basis of the power consumption amount for each first time interval which is output at each first time interval, and the occurrence time of the first event which occurs during the first time interval. In other words, the power estimation unit 123 calculates the power consumption amount in the event of occurrence of the first event, by referring to the information included in the sampling information 131 acquired by the information acquisition unit 121.

More specifically, the power estimation unit 123 distributes the power consumption amount for each first time interval, to each second time interval, for example, and estimates the value distributed to a second time interval which includes the occurrence time of a first event, as the power consumption amount in the event of the occurrence of the first event. A specific example of the processing by the power estimation unit 123 is described below.

Overview of First Embodiment

Figure 6:
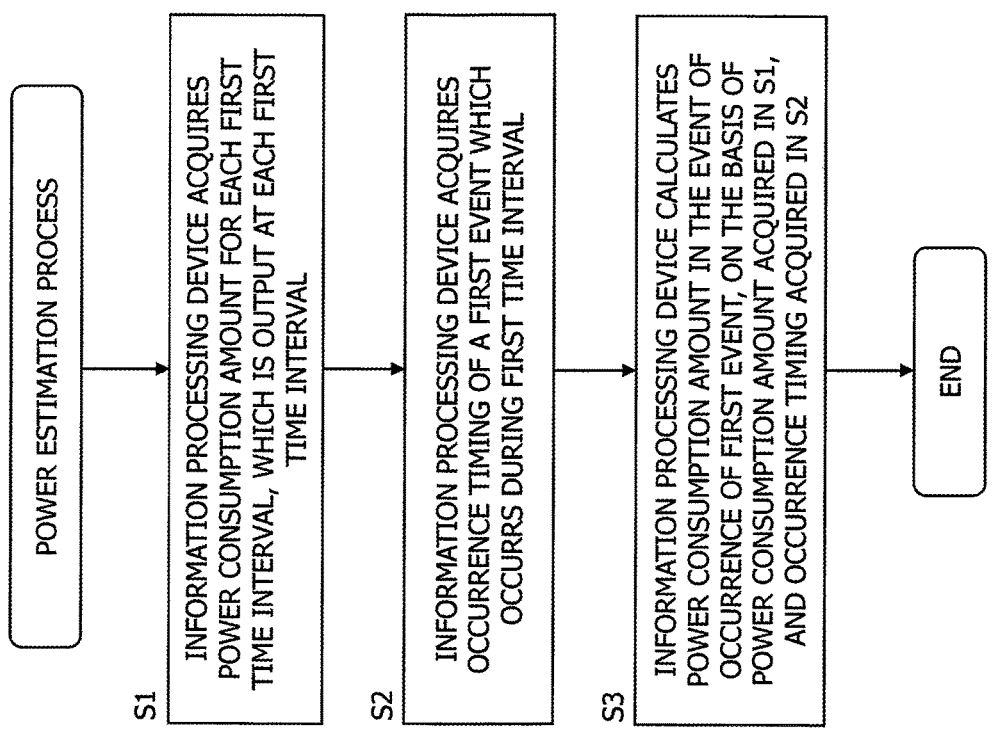
FIG. 6 is a flowchart for describing an overview of an estimation process according to the first embodiment.

Next, an overview of the first embodiment will be described. FIG. 6 is a flowchart for describing an overview of an estimation process according to the first embodiment. Furthermore, FIG. 7 is a diagram for describing an overview of an estimation process according to the first embodiment. The estimation process in FIG. 6 is described here with reference to FIG. 7.

As illustrated in FIG. 6, the information processing device 1 acquires the power consumption amount for each first time interval which is output at each first time interval (S1). Furthermore, the information processing device 1 acquires the occurrence time of the first event which occurs during the first time interval (S2). More specifically, the information processing device 1 acquires the power consumption amount for each first time interval, and information about the occurrence time of the first event, by acquiring the sampling information 131 stored in the information storage region 130. A specific example of the sampling information 131 in the first embodiment is described below.

Thereupon, as illustrated in FIG. 7, the information processing device 1 calculates the power consumption amount in the event of occurrence of the first event, on the basis of the power consumption amount acquired in S1 and the occurrence time acquired in S2 (S3).

In other words, there are cases where the time taken for the first event (execution of a function included in the program, for example) to be completed is shorter than the time interval (first time interval) at which the power measurement unit 113 of the CPU 101 is capable of measuring the power consumption amount of the CPU 101. In this case, the information acquisition unit 121 and the information analysis unit 122 of the information processing device 1 cannot acquire the power consumption amount associated with the occurrence of the first event, and a power profile corresponding to the occurrence of the first event cannot be made accurately.

Therefore, the information processing device 1 (power estimation unit 123) according to the present embodiment calculates the power consumption amount associated with the occurrence of the first event, on the basis of the power consumption amount for each first time interval output from the power measurement unit 113. More specifically, the information processing device 1 distributes the power consumption amount for each first time interval, to each second time interval, for example, and calculates the value distributed to a second time interval which includes the occurrence time of a first event, as the power consumption amount in the event of the occurrence of the first event.

Therefore, the information processing device 1 (information analysis unit 122) can make a power profile for the first event, accurately, from the estimated power consumption amount in the event of occurrence of the first event, even if the first event is an event which is completed in a shorter time period than the first time interval.

Details of First Embodiment

Figure 8:
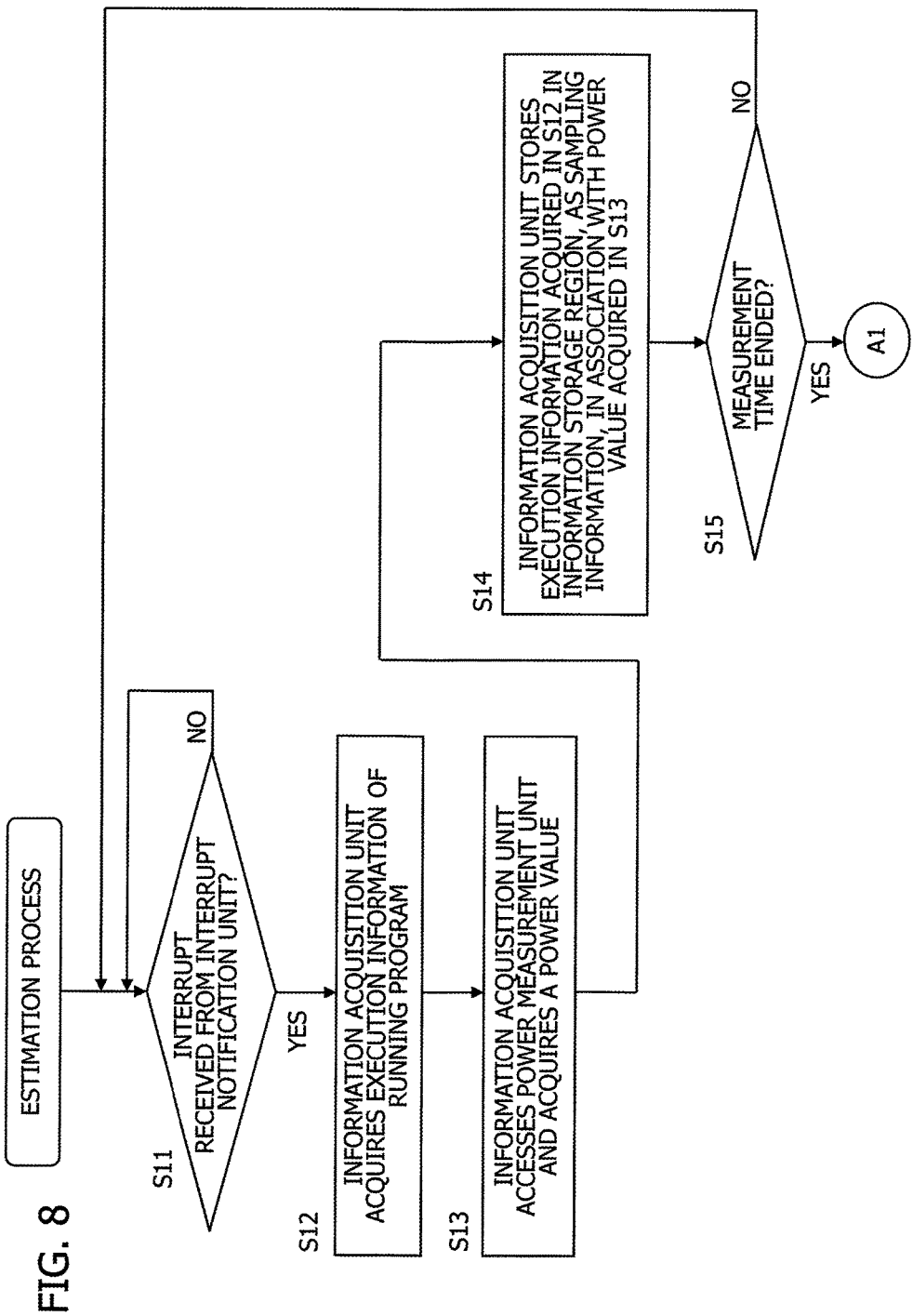
FIGS. 8 to 10 are flowcharts for describing the details of the estimation process according to the first embodiment.
Figure 9:
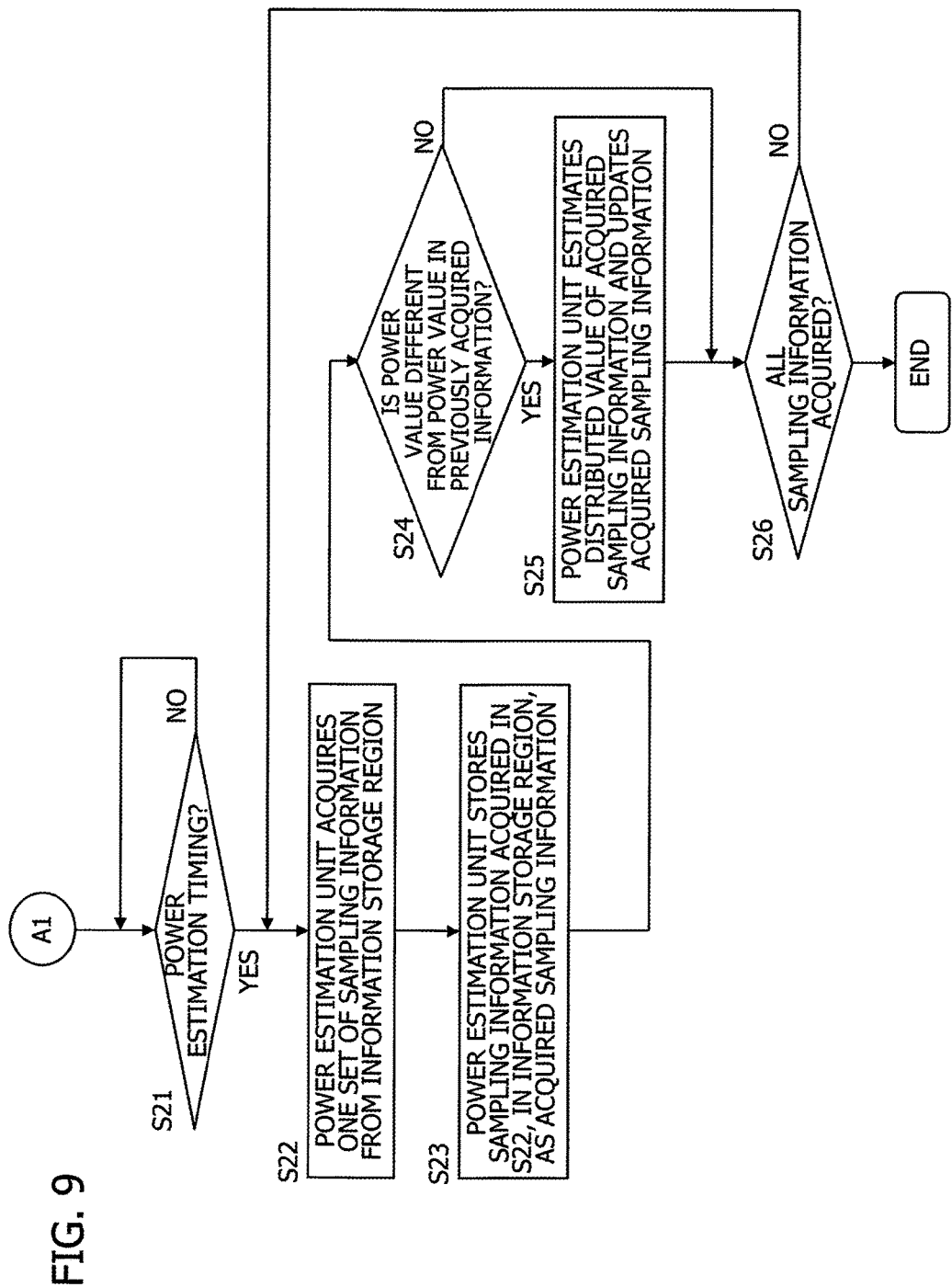
Figure 10:
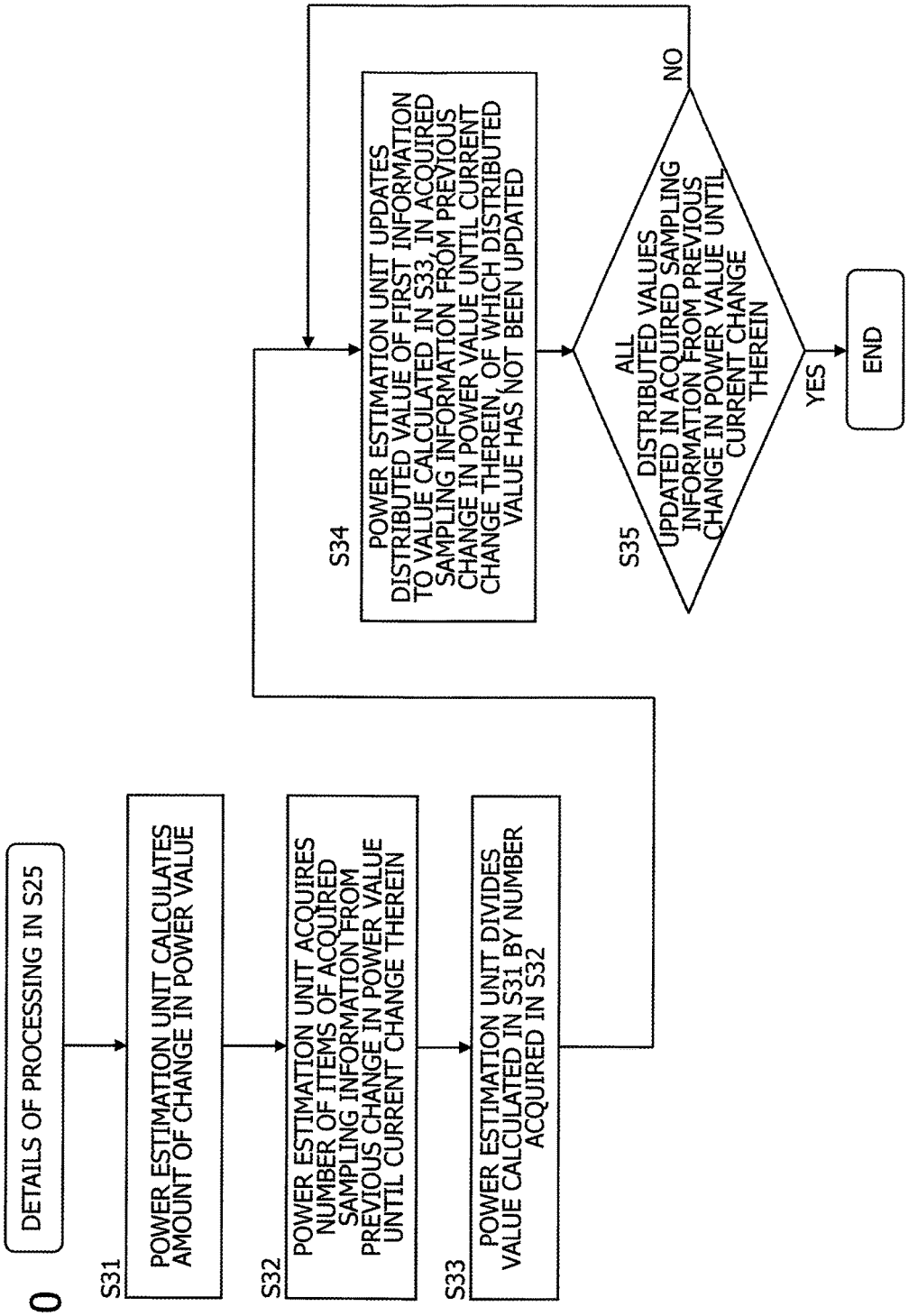

Next, the details of the first embodiment will be described. FIGS. 8 to 10 are flowcharts for describing the details of the estimation process according to the first embodiment. FIGS. 11 to 17 are diagrams for describing the details of the estimation process according to the first embodiment. The estimation process in FIGS. 8 to 10 is explained below with reference to FIGS. 11 to 17.

Firstly, the information acquisition unit 121 waits until receiving an interrupt notification from the interrupt notification unit 112, as illustrated in FIG. 8 (NO in S11). In other words, when the CPU 101 has a PMC, then the CPU 101 (interrupt notification unit 112) is able to issue an interrupt notification to the information acquisition unit 121 at prescribed time intervals apart (for example, at intervals of one millisecond or 100 microseconds). Therefore, the information acquisition unit 121 carries out the process from S12 onwards, in accordance with receiving an interrupt notification from the interrupt notification unit 112.

When an interrupt notification is received (YES in S11), the information acquisition unit 121 accesses the program execution unit 111, for instance, and acquires execution information for the analysis object program which is currently running in the program execution unit 111 (S12). The program operation information is, for example, information for identifying a function included in the analysis object program. More specifically, the execution information of the analysis object program is the process ID and instruction address, for example. In other words, there are cases where, depending on the functions of the CPU 101, etc., the power measurement unit 113 of the CPU 101 is not able to notify the information acquisition unit 121 about the measured information (the power consumption amount of the CPU 101). Consequently, the information acquisition unit 121 accesses the power measurement unit 113, in accordance with receiving an interrupt notification from the interrupt notification unit 112, for instance, and acquires the power consumption amount of the CPU 101.

Thereupon, the information acquisition unit 121 creates the sampling information 131 by associating the execution information acquired in S12 and the power value acquired in S13 (S14). The information acquisition unit 121 stores the created sampling information 131 in the information storage region 130 (S14). Thereby, as described below, the power estimation unit 123 is able to estimate the power consumption amount associated with the occurrence of the first event. Below, a specific example of the sampling information 131 according to the present embodiment will be explained.

[Specific Example of Sampling Information 131]

FIG. 11 is a diagram illustrating a specific example of the sampling information 131. The sampling information 131 illustrated in FIG. 11 includes, in addition to the items of the sampling information 131 illustrated in FIG. 3, an "distributed value" which sets the result of distributed of the value set in the power value.

The interrupt notification unit 112 is described below in a case where an interrupt notification is issued to the information acquisition unit 121 every 200 microseconds. Furthermore, the power measurement unit 113 is described in a case where the power consumption amount of the CPU 101 is measured every 1 millisecond. In other words, the description below is based on a case where the first time interval is one millisecond, and the second time interval is 200 microseconds.

More specifically, in the sampling information 131 illustrated in FIG. 11, in the information having an "ID" of "1", the "process ID" is set to "12980", the "instruction address" is set to "0x0040460", and the "power value" is set to "8 (J)". Furthermore, in the information having an "ID" of "1" in the sampling information 131 illustrated in FIG. 11, the "distributed value" is set to an initial value of "0" and the "time" is set to "10:10:00.000000". In the example illustrated in FIG. 11, the initial value set in the "distributed value" may be information other than "0".

Here, the information acquisition unit 121 stores the sampling information 131 in the information storage region 130, each time an interrupt notification transmitted from the interrupt notification unit 112 is received (S14). Therefore, times at intervals of 200 microseconds apart are stored as the "time" included in the sampling information 131 illustrated in FIG. 11.

On the other hand, the power measurement unit 113 measures the power consumption amount of the CPU 101 every 1 millisecond. In other words, in the example illustrated in FIG. 11, the measurement result for the power consumption amount of the CPU 101 by the power measurement unit 113 is not updated in the period of "time" from "10:10:00.000000" to "10:10:00.000800". Therefore, of the information set in the "power value" included in the sampling information 131 illustrated in FIG. 11, the information items corresponding to an "information ID" from "1" to "5"

are all set to the same power value of "8 (J)". The other information included in FIG. 11 is not explained here.

Returning to FIG. 8, the information acquisition unit 121 determines whether or not a measurement time of the sampling information 131, which is set previously, for instance, has ended (S15). If it is determined that the measurement time of the sampling information 131 has not ended (NO in S15), then the information acquisition unit 121 repeats the processing from S11 onwards.

On the other hand, if it is determined that the measurement time of the sampling information 131 has ended (YES in S15), then the power estimation unit 123 waits until the power estimation timing, as illustrated in FIG. 9 (NO at S21). The power estimation timing is, for example, a timing that is set previously in the information processing device 1 by the operator. Furthermore, the power estimation timing may be a timing immediately after completion of the measurement time of the sampling information 131, for example.

Thereafter, when the power estimation timing is reached (YES in S21), the power estimation unit 123 acquires one set of information from the sampling information 131 stored in the information storage region 130 (S22). More specifically, the power estimation unit 123 acquires one line of information, from among the information included in the sampling information 131 illustrated in FIG. 11, for example.

The power estimation unit 123 stores the sampling information 131 acquired in S22, in the information storage region 130, as acquired sampling information 132 (S23). A specific example of the acquired sampling information 132 after carrying out the process in S23 is described below.

[Specific Example of Acquired Sampling Information 132 (1)]

FIG. 12 is a diagram illustrating a specific example of the acquired sampling information 132 after carrying out the process in S23. The acquired sampling information 132 illustrated in FIG. 12 is information obtained by acquiring the sampling information 131 stored in the information storage region 130. Therefore, the acquired sampling information 132 illustrated in FIG. 12 has the same items as the sampling information 131 illustrated in FIG. 11. More specifically, the acquired sampling information 132 illustrated in FIG. 12 includes the same information as the information having an "information ID" of "1", of the sampling information 131 illustrated in FIG. 11.

Returning to FIG. 9, the power estimation unit 123 determines whether or not the information set in the "power value" of the information acquired in S22 is different from the information set in the "power value" of the information acquired previously (S24). When the information set in the "power value" is different (YES in S24), then the power estimation unit 123 estimates the information to be set in the "distributed value" of the acquired sampling information 132, and updates the information included in the acquired sampling information 132 (S25). In other words, in the "distributed value" of the acquired sampling information 132, the power estimation unit 123 sets information indicating the estimation result for the power consumption amount associated with the execution of each function for which information is included in the acquired sampling information 132.

On the other hand, if the information set in the "power value" of the information acquired in S23 is not different from the information set in the "power value" of the previously acquired information (NO in S24), then the power estimation unit 123 does not carry out the process in S25. The details of the processing in S25 are described below.

More specifically, the acquired sampling information 132 illustrated in FIG. 12 includes only information of which the "information ID" is "1", and therefore does not include information that has been acquired previously. Therefore, in this case, the power estimation unit 123 does not carry out the process in S25 (NO in S24).

When acquisition of all of the sampling information 131 stored in the information storage region 130 has been completed (YES in S26), then the power estimation unit 123 terminates the estimation process. On the other hand, if acquisition of all of the sampling information 131 stored in the information storage region 130 has not been completed (NO in S26), then the power estimation unit 123 repeats the process from S22 onwards. More specifically, in the example illustrated in FIG. 12, the acquisition of all of the sampling information 131 illustrated in FIG. 11 has not been completed. Therefore, the power estimation unit 123 executes the processing from S22 onwards.

[Specific Example of Acquired Sampling Information 132 (2)]

Next, a process performed by the power estimation unit 123 after having repeated the processing from S22 to S26 five times (namely, the sixth process) will be described.

FIGS. 13 to 15 are diagrams illustrating the acquired sampling information 132 in a case where the process in S23 has been carried out six times. More specifically, the acquired sampling information 132 illustrated in FIG. 13 includes information corresponding to an "information ID" from "1" to "6", of the sampling information 131 illustrated in FIG. 11.

Here, in the acquired sampling information 132 illustrated in FIG. 13, values other than the values set hitherto for the "power value" are set in the "power value" corresponding to the information having an "information ID" of "6". More specifically, the information ("23 (J)") set in the "power value" of the information acquired in S22 (the information having an "information ID" of "6") is different from the information ("8 (J)") set in the "power value" of the information acquired previously (the information having an "information ID" of "5") (YES in S24). Therefore, in this case, the power estimation unit 123 executes the process from S25 onwards. The details of the process in S25 are described below.

[Details of Process in S25]

As illustrated in FIG. 10, the power estimation unit 123 calculates the amount of change in the information set in the "power value" of the currently acquired information, with respect to the information set in the "power value" of the previously acquired information (S31).

More specifically, in the acquired sampling information 132 illustrated in FIG. 13, "8 (J)" is set in the "power value" of the information having an "information ID" of "5", and "23 (J)" is set in the "power value" of the information having an "information ID" of "6". Therefore, in this case, the power estimation unit 123 calculates "15 (J)" as the amount of change in the information set in the "power value".

Next, the power estimation unit 123 acquires the number of items of acquired sampling information 132 that have been acquired from the previous change in the value set in the "power value" of the acquired sampling information 132, until the current change therein (S32). The acquired sampling information 132 of which the value set in the "power value" has changed includes information that was acquired initially by the power estimation unit 123 (the information having an "information ID" of "1" in the example illustrated in FIG. 13).

More specifically, in the acquired sampling information 132 illustrated in FIG. 13, the information of which the value set in the "power value" was changed previously is the information having an "information ID" of "1", and the information of which the value set in the "power value" has changed currently is the information having an "information ID" of "6". Therefore, the acquired sampling information 132 that has been acquired from the previous change in the value set in the "power value" of the acquired sampling information 132 until the current change therein, corresponds to information having an "information ID" from "2" to "6". Consequently, the power estimation unit 123 acquires "5" as the number of items of acquired sampling information 132 acquired from the previous change in the value set in the "power value" of the acquired sampling information 132, until the current change therein.

If the information acquisition unit 121 creates the sampling information 131 at even intervals apart, then the power estimation unit 123 may divide the time period from the previous change in the value set in the "power value" of the acquired sampling information 132 until the current change therein, by the creation interval of the sampling information 131.

More specifically, in the example illustrated in FIG. 13, the time period from "10:10:00.000000", which is the "time" of the information having an "information ID" of "1", until "10:10:10:000100", which is the "time" of the information having an "information ID" of "6", is one millisecond. Therefore, in the example illustrated in FIG. 13, the creation interval of the sampling information 131 is 200 microseconds. Consequently, the power estimation unit 123 may calculate "5" as the number of items of acquired sampling information 132 acquired from the previous change in the value set in the "power value" of the acquired sampling information 132, until the current change therein, by dividing one millisecond by 200 microseconds.

Subsequently, the power estimation unit 123 divides the value calculated in S31 by the number acquired in S32 (S33). More specifically, in example illustrated in FIG. 13, the power estimation unit 123 acquires "3 (J)" which is the result of dividing the "15 (J)" calculated in S31 by the "5" acquired in S32.

Moreover, the power estimation unit 123 identifies the first information among the information of which the value set for the "distributed value" has not been updated, in the acquired sampling information 132 that has been acquired from the previous change in the value set for the "power value" of the acquired sampling information 132 until the current change therein. The power estimation unit 123 then updates the value set in the "distributed value" of the identified information, to the value calculated in S33 (S34).

More specifically, the acquired sampling information 132 that has been acquired from the previous change in the value set in the "power value" of the acquired sampling information 132 until the current change therein is the information having an "information ID" from "2" to "6". The first information of the information items among these information items in which the value set in the "distributed value" of the acquired sampling information 132 has not been updated, is the information having an "information ID" of "2". Therefore, as indicated by the underlined portion in FIG. 14, the power estimation unit 123 updates the information set in the "distributed value" of the information having an "information ID" of "2", to "3 (J)".

When the information set in the "distributed value" of the acquired sampling information 132 acquired from the previous change in the value set in the "power value" until the current change therein has all been updated (YES in S35), then the power estimation unit 123 terminates the process in S25. On the other hand, if all of the information set in the "distributed value" has not been updated (NO in S35), then the process from S34 onwards is repeated. Consequently, as indicated by the underlined portions in FIG. 15, the power estimation unit 123 is able to update the information set in the "distributed value" of the acquired sampling information 132 acquired from the previous change in the value set in the "power value" until the current change therein.

[Specific Example of Acquired Sampling Information 132 (3)]

Next, a process performed by the power estimation unit 123 after having repeated the processing from S22 to S26 ten times (namely, the eleventh process) will be described.

FIGS. 16 and 17 are diagrams illustrating the acquired sampling information 132 in a case where the process in S23 has been carried out eleven times. The acquired sampling information 132 illustrated in FIG. 16 includes information corresponding to an "information ID" from "1" to "11", of the sampling information 131 illustrated in FIG. 11.

Here, in the acquired sampling information 132 illustrated in FIG. 16, the "power value" of the information having an "information ID" of "11" is set to "28 (J)", which is information that is different to "23 (J)", which is the information set as the "power value" of the information having an "information ID" of "10".

Therefore, in this case, the power estimation unit 123 calculates "5 (J)" as the amount of change in the information set in the "power value" (S31). Furthermore, the power estimation unit 123 acquires "5" as the acquired number of items of acquired sampling information, from the previous determination of change in the information set in the "power value" of the acquired information, until the current determination thereof (S32). The power estimation unit 123 calculates "1 (J)" by dividing "5 (J)" which is the value calculated in S31, by the value "5" acquired in S32 (S33).

Thereupon, as indicated by the underlined portions in FIG. 17, the power estimation unit 123 sets the value of "1" acquired in S33, in the "distributed value" of the information having an "information ID" from "7" to "11", in order from the first information (S34, S35).

In this way, the information processing device 1 according to the present embodiment has a power estimation unit 123 which estimates the power consumption amount in the event of the occurrence of the first event, on the basis of the power consumption amount for each first time interval which is output at each first time interval, and the occurrence time of the first event which occurs during the first time interval.

In other words, the information processing device 1 according to the present embodiment acquires by estimation the power consumption amount associated with the occurrence of a first event (for example, the execution of a function included in a program) even if the first event is an event which ends within a shorter time than the first time interval. Consequently, the information processing device 1 is able to make a power profile in respect of the first event, with good accuracy, regardless of whether or not the first event ends within a shorter time than the first time interval.

Second Embodiment

Figure 18:
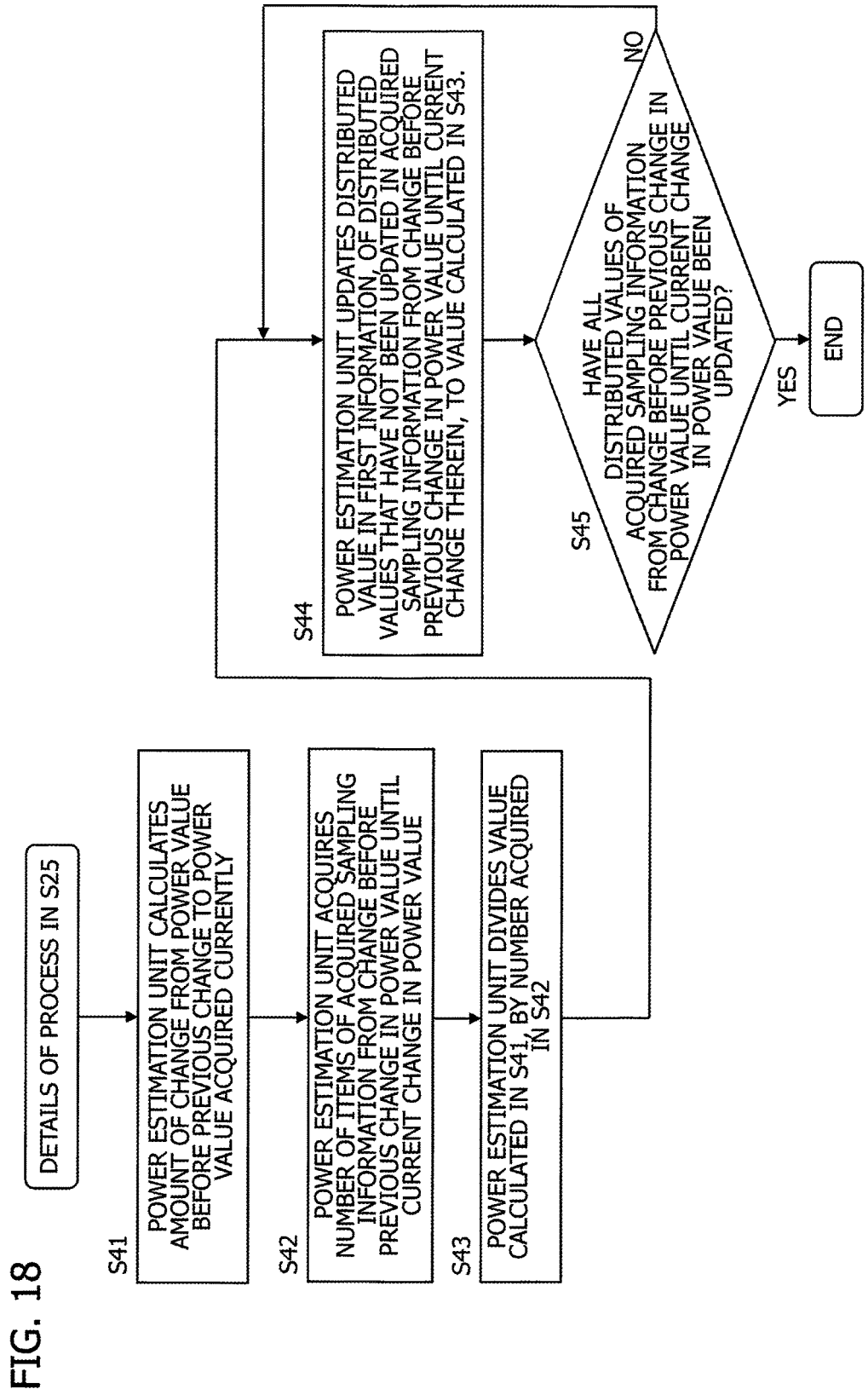
FIG. 18 is a flowchart for describing an overview of an estimation process according to the second embodiment.

Next, a second embodiment of the present invention will be described. FIG. 18 is a flowchart for describing an overview of an estimation process according to the second embodiment. FIGS. 19 and 20 are flowcharts for describing the estimation process according to the second embodiment.

More specifically, FIGS. 19 and 20 are diagrams illustrating the acquired sampling information 132 in a case where the process in S23 has been carried out eleven times. The estimation process in FIG. 18 is described here with reference to FIGS. 19 and 20.

In contrast to the first embodiment, the estimation process according to the second embodiment takes account not only of the information indicating the state at the time of the previous change in the value set in the "power value" of the acquired sampling information 132, but also information about the state at the time of the change before the previous change. In other words, the power estimation unit 123 according to the second embodiment estimates the power consumption amount associated with the execution of the functions for which information is included in the sampling information 131, on the basis of the power consumption amount for each of a plurality of consecutive first time intervals. Consequently, the power estimation unit 123 is able to estimate the power consumption amount more accurately. The estimation process according to the second embodiment differs only in respect of the process in S25, compared to the first embodiment. Therefore, the process in S25 of the second embodiment is described below.

[Details of the Process in S25 According to the Second Embodiment]

As illustrated in FIG. 18, the power estimation unit 123 calculates the amount of change from the value set in the "power value" before the previous change in the value set in the "power value", of the information included in the acquired sampling information 132, to the value set in the "power value" of the information acquired currently (S41).

More specifically, in the acquired sampling information 132 illustrated in FIG. 16, for example, the "power value" of the information acquired currently (the information having an "information ID" of "11") is "28 (J)". Furthermore, in the acquired sampling information 132 illustrated in FIG. 16, the value set in the "power value" after the previous change is "23 (J)" (for example, the information having an "information ID" of "6"), and the "power value" before the previous change (and after the change before the previous change) is "8 (J)" (for example, the information having an "information ID" of "1"). Therefore, in this case, the power estimation unit 123 calculates "20 (J)" as the amount of change from "8 (J)" to "28 (J)".

Next, the power estimation unit 123 acquires the number of items of acquired sampling information 132 acquired from the change before the previous change in the value set in the "power value" of the acquired sampling information 132, until the current change therein (S42).

More specifically, in the acquired sampling information 132 illustrated in FIG. 16, the information of which the value set in the "power value" was changed before the previous change is the information having an "information ID" of "1", and the information of which the value set in the "power value" has changed currently is the information having an "information ID" of "11". Therefore, the acquired sampling information 132 that has been acquired from the change before the previous change in the value set in the "power value" of the acquired sampling information 132 until the current change therein, corresponds to information having an "information ID" from "2" to "11". Consequently, the power estimation unit 123 acquires "10" as the number of items of acquired sampling information 132 acquired from the change before the previous change in the value set in the "power value" of the acquired sampling information 132, until the current change therein.

Subsequently, the power estimation unit 123 divides the value calculated in S41 by the number acquired in S42 (S43). More specifically, in example illustrated in FIG. 16, the power estimation unit 123 acquires "2 (J)" which is the result of dividing the "20 (J)" calculated in S41 by the "10" acquired in S42.

Moreover, the power estimation unit 123 identifies the information of which the value set for the "distributed value" has not been updated, in the acquired sampling information 132 that has been acquired from the change before the previous change in the value set for the "power value" of the acquired sampling information 132 until the current change therein. The power estimation unit 123 then updates the value set in the "distributed value" of the first information, of the identified information, to the value calculated in S43 (S44).

More specifically, in the example illustrated in FIG. 16, the acquired sampling information 132 that has been acquired from the change before the previous change in the value set in the "power value" of the acquired sampling information 132 until the current value therein is information having an "information ID" from "2" to "11". The first information of the information items, among this information, in which the value set in the "distributed value" of the acquired sampling information 132 has not been updated, is the information having an "information ID" of "2". Therefore, as indicated by the underlined portion in FIG. 19, the power estimation unit 123 updates the information set in the "distributed value" of the information having an "information ID" of "2", to "2 (J)". The power estimation unit 123 according to the second embodiment updates the value set in the "distributed value" of the information included in the acquired sampling information 132, two times respectively, as in the information having an "information ID" of "2" in FIG. 19 (information of which the "distributed value" has already been updated to "3 (J)" in FIG. 16).

When the information set in the "distributed value" of the acquired sampling information 132 acquired from the change before the previous change in the value set in the "power value" until the current change therein has all been updated (YES in S45), then the power estimation unit 123 terminates the process in S25. On the other hand, if all of the information set in the "distributed value" has not been updated (NO in S45), then the process from S44 onwards is repeated. Consequently, as indicated by the underlined portions in FIG. 20, the power estimation unit 123 is able to update the information set in the "distributed value" of the acquired sampling information 132 that has been acquired from change before the previous change in the value set in the "power value" until the current change therein.

Third Embodiment

Next, a third embodiment of the present invention will be described. FIG. 21 is a flowchart for describing an estimation process according to the third embodiment. Furthermore, FIGS. 22 and 23 are flowcharts for describing the estimation process according to the third embodiment. More specifically, FIGS. 22 and 23 are diagrams illustrating the acquired sampling information 132 in a case where the process in S23 has been carried out eleven times. The estimation process in FIG. 21 is described here with reference to FIGS. 22 and 23.

In contrast to the second embodiment, the estimation process according to the third embodiment determines the value set in the distributed value of the acquired sampling information 132, on the basis of the first weighting information and the second weighting information. The first weighting information and the second weighting information is information for determining a weighting value which is used when determining the value to be set in the "distributed value" of the acquired sampling information 132. Consequently, the power estimation unit 123 is able to estimate the power consumption amount more accurately. The estimation process according to the third embodiment differs only in respect of the process in S25, compared to the first embodiment and the second embodiment. Therefore, the details of the process in S25 of the third embodiment are described below.

[Details of the Process in S25 According to the Third Embodiment]

As illustrated in FIG. 21, the power estimation unit 123 calculates the amount of change between the value set in the "power value" before the previous change, in the information included in the acquired sampling information 132, and the value set in the "power value" after the previous change (called the "first amount of change" below). Furthermore, the power estimation unit 123 calculates the amount of change between the value set in the "power value" after the previous change, in the information included in the acquired sampling information 132, and the value set in the "power value" of the acquired sampling information 132 that has been acquired currently (called the "second amount of change" below) (S51).

More specifically, in the acquired sampling information 132 illustrated in FIG. 16, the "power value" of the information acquired currently (the information having an "information ID" of "11") is "28 (J)". Furthermore, in the acquired sampling information 132 illustrated in FIG. 16, the "power value" before the previous change is "8 (J)" (for example, the information having an "information ID" of "1"), and the "power value" after the previous change is "23 (J)" (for example, the information having an "information ID" of "6"). Therefore, in this case, the power estimation unit 123 calculates "15 (J)", which is the amount of change from "8 (J)" to "23 (J)", as the first amount of change. Furthermore, in this case, the power estimation unit 123 calculates "5 (J)", which is the amount of change from "23 (J)" to "28 (J)", as the second amount of change.

Next, the power estimation unit 123 acquires the number of items of acquired sampling information 132 acquired from the change before the previous change in the value set in the "power value" of the acquired sampling information 132, until the current change therein (S52).

More specifically, in the acquired sampling information 132 illustrated in FIG. 16, the information of which the value set in the "power value" was changed before the previous change is the information having an "information ID" of "1", and the information of which the value set in the "power value" has changed currently is the information having an "information ID" of "11". Therefore, the acquired sampling information 132 that has been acquired from the previous change in the value set in the "power value" of the acquired sampling information 132 until the current change therein, corresponds to information having an "information ID" from "2" to "11". Consequently, the power estimation unit 123 acquires "10" as the number of items of acquired sampling information 132 that have been acquired from the previous change in the value set in the "power value" of the acquired sampling information 132, until the current change therein.

Subsequently, the power estimation unit 123 calculates a first reference value and a second reference value by multiplying the first amount of change and the second amount of change calculated in S51, by "2", and then dividing by the value acquired in S52 (S53).

More specifically, in the example illustrated in FIG. 16, the power estimation unit 123 calculates "3 (J)" as the first reference value, by dividing the value ("30 (J)") obtained by multiplying the first amount of change "15 (J)" calculated in S51 by "2", by the value ("10") acquired in S52. Furthermore, in the example illustrated in FIG. 16, the power estimation unit 123 calculates "1 (J)" as the second reference value, by dividing the value ("10 (J)") obtained by multiplying the second amount of change "5 (J)" calculated in S51 by "2", by the value ("10") acquired in S52. The first amount of change and the second amount of change are each values corresponding to the first time interval (which is a one millisecond interval in the example illustrated in FIG. 16), whereas the value acquired in S52 is a value corresponding to a time interval that is two times the first time interval (a two millisecond interval in the example illustrated in FIG. 16). Therefore, in the process in S53, the power estimation unit 123 multiplies the first amount of change and the second amount of change by "2" and then divides by the value acquired in S52.

Thereupon, the power estimation unit 123 identifies the first information among the information of which the value set for the "distributed value" has not been updated, in the acquired sampling information 132 from the change before the previous change in the value set for the "power value" until the current change therein. The power estimation unit 123 calculates a weighting value corresponding to the value set in the "distributed value" of the identified information, on the basis of the first weighting information and the second weighting information stored in the information storage region 130 (S54). The first weighting information and the second weighting information are described below.

The first weighting information is information for determining a weighting value to be multiplied by the first reference value (called the "first weighting value" below), when determining the value to be set in the "distributed value" of the acquired sampling information 132. More specifically, the first weighting information may be composed as indicated in Formula (1) below, for example. Below, the number of items of acquired sampling information 132 from the change before the previous change in the value set in "power value", until the current change, is also called simply the "number of samples". Furthermore, the sequence number from the first item of information included in the acquired sampling information 132 from the change before the previous change in the value set in "power value", until the current change, is also called simply the "sequence number".

First weighting value=1−(1/(number of samples−1))*(sequence number−1)  Formula (1)

In other words, in the acquired sampling information 132 illustrated in FIG. 16, the "number of samples" is "10" (the information having an "information ID" from "2" to "11"). Therefore, for example, in the case of the information having an "information ID" of "2" (the information having a "sequence number" of "1"), the first weighting value is "1". Furthermore, for example, in the case of information having an "information ID" of "4" (the information having a "sequence number" of "3"), the first weighting value is "0.78" (to two significant figures).

Next, the second weighting information will be described. The second weighting information is information for determining a weighting value to be multiplied by the second reference value (called the "second weighting value" below), when determining the value to be set in the "distributed value" of the acquired sampling information 132. More specifically, the second weighting information may be composed as indicated in Formula (2) below, for example.

Second weighting value=(1/(number of samples−1))* (sequence number−1)   Formula (2)

In other words, in the acquired sampling information 132 illustrated in FIG. 16, the "number of samples" is "10". Therefore, for example, in the case of information having an "information ID" of "2" (the information having a "sequence number" of "1"), the first weighting value is "0". Furthermore, for example, in the case of information having an "information ID" of "5" (the information having a "sequence number" of "4"), the second weighting value is "0.33" (to two significant figures).

Returning to FIG. 21, the power estimation unit 123 adds the value obtained by multiplying the first reference amount by the first weighting value, to the value obtained by multiplying the second reference value by the second weighting value (S55). More specifically, in the example illustrated in FIG. 16, the power estimation unit 123 calculates "3 (J)" as the sum of the value obtained by multiplying the first reference value "3 (J)" by the first weighting value "1", and the value obtained by multiplying the second reference value "1 (J)" by the second weighting value "0".

Thereupon, the power estimation unit 123 identifies the first information among the information of which the value set for the "distributed value" has not been updated, in the acquired sampling information 132 from the change before the previous change in the value set for the "power value" until the current change therein. The power estimation unit 123 then updates the value set in the "distributed value" of the identified information, to the value calculated in S55 (S56). More specifically, in the example illustrated in FIG. 16, the power estimation unit 123 updates the "distributed value" of the information having an "information ID" of "2", to the value of "3 (J)" calculated in S55, as indicated by the underlined portion in FIG. 22.

When the information set in the "distributed value" of the acquired sampling information 132 that has been acquired from the change before the previous change in the value set in the "power value" until the current change therein has all been updated (YES in S57), then the power estimation unit 123 terminates the process in S25. On the other hand, if all of the information set in the "distributed value" has not been updated (NO in S57), then the process from S54 onwards is repeated.

Consequently, as indicated by the underlined portions in FIG. 23, the power estimation unit 123 is able to update the information set in the "distributed value" of the acquired sampling information 132 acquired from change before the previous change in the value set in the "power value" until the current change therein. The number of significant figures of the value set in the "distributed value" of the acquired sampling information 132 illustrated in FIG. 23 is two.

Fourth Embodiment

Figure 24:
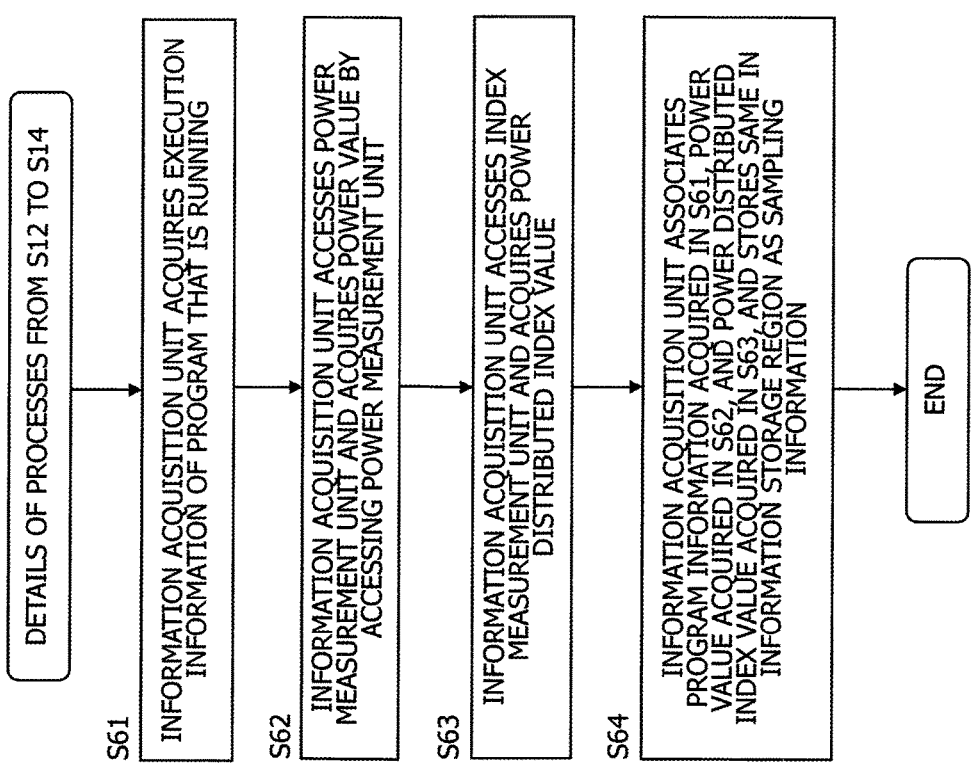
FIGS. 24 and 25 are flowcharts for describing the estimation process according to the fourth embodiment.
Figure 25:
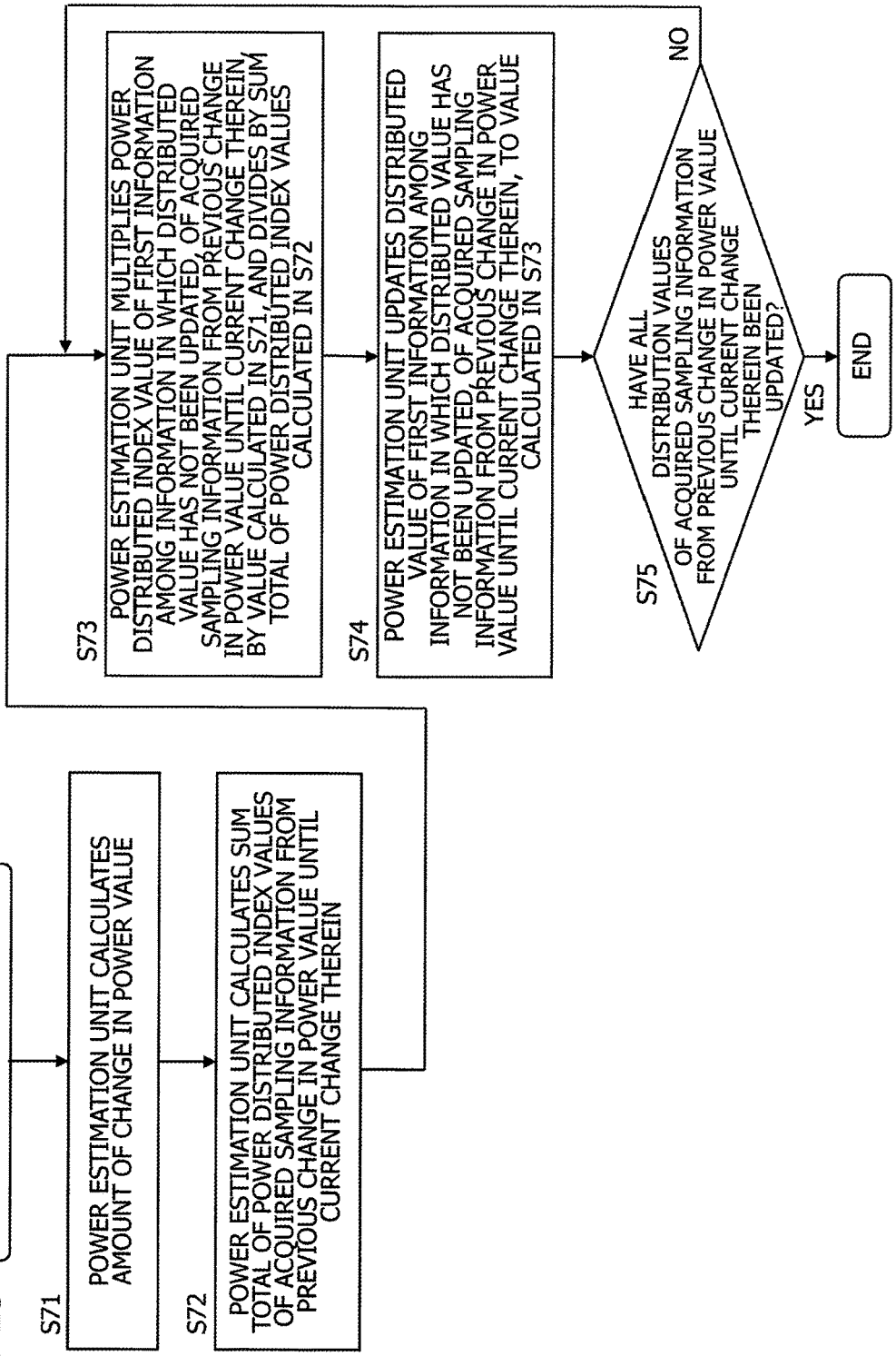

Next, a fourth embodiment of the present invention will be described. FIGS. 24 and 25 are flowcharts for describing the estimation process according to the fourth embodiment. Furthermore, FIGS. 26 to 29 are also flowcharts for describing the estimation process according to the fourth embodiment. More specifically, FIG. 26 is a diagram for describing the configuration of an information processing device 1 according to the fourth embodiment. Furthermore, FIGS. 27 to 29 are diagrams illustrating the acquired sampling information 132 in a case where the process in S23 has been carried out six times. The estimation process in FIGS. 24 and 25 is explained below with reference to FIGS. 26 to 29.

In the estimation process of the fourth embodiment, in contrast to the first to third embodiments, when the information acquisition unit 121 acquires the power consumption amount of the CPU 101, an index value related to the operation of the CPU 101 at that time (called "power distributed index value" below) is acquired. The power estimation unit 123 estimates the power consumption amount on the basis of the power distributed index value. Consequently, the power estimation unit 123 is able to estimate the power consumption amount more accurately. The estimation process according to the fourth embodiment differs only in respect of the processes from S12 to S24 and the process in S25, compared to the first embodiment. Therefore, only the processes which are different from the first embodiment are described below.

[Processes from S12 to S14 According to the Fourth Embodiment]

When an interrupt notification is received in the process in S11 illustrated in FIG. 8 (YES in S11 in FIG. 8), the information acquisition unit 121 accesses the program execution unit 111 and acquires the execution information of the analysis object program, similarly to the first embodiment, as illustrated in FIG. 24 (S12 in FIG. 8, S61). Furthermore, the information acquisition unit 121 accesses the power measurement unit 113, in accordance with receiving an interrupt notification from the interrupt notification unit 112, and acquires the power consumption amount of the CPU 101 (S13 in FIG. 8, S62).

Moreover, in contrast to the first embodiment, the information acquisition unit 121 according to the fourth embodiment accesses the index measurement unit 114 and acquires a power distributed index value (S63). The power distributed index value, for example, may be an index value based on an event related to memory access. More specifically, the power distributed index value is, for example, a value indicating the number of cache misses occurring during memory access. The index measurement unit 114, for example, may be composed of a portion of the functions of the CPU 101 (for example, the PMC), as illustrated in FIG. 26.

Thereupon, the information acquisition unit 121 creates the sampling information 131 by associating the execution information acquired in S61, the power value acquired in S62, and the power distributed index value acquired in S63 (S64). The information acquisition unit 121 stores the created sampling information 131 in the information storage region 130 (S64).

[Specific Example of Acquired Sampling Information 132 (4)]

Next, a specific example of the acquired sampling information 132 according to the fourth embodiment will be described. FIG. 27 is a diagram for describing a concrete example of the acquired sampling information 132 according to the fourth embodiment.

The acquired sampling information 132 illustrated in FIG. 27 has an item "power distributed index value" which sets a power distributed index value, in comparison with the acquired sampling information 132 illustrated in FIG. 13, etc. More specifically, in the acquired sampling information 132 illustrated in FIG. 27, values of "200", "100", "400", "200", "100" and "200" are set respectively as the "power distributed index value". The sampling information 131 of the fourth embodiment is information having the same contents as the acquired sampling information 132 illustrated in FIG. 27, and therefore description thereof is omitted here.

[Process in S25 According to the Fourth Embodiment]

Next, the details of the process in S25 of the fourth embodiment are described. FIG. 25 is a diagram illustrating the details of the process in S25 according to the fourth embodiment.

As illustrated in FIG. 25, the power estimation unit 123 calculates the amount of change in the information set in the "power value" of the currently acquired information, with respect to the information set in the "power value" of the previously acquired information (S71).

More specifically, in the example illustrated in FIG. 27, "8 (J)" is set in the "power value" of the information having an "information ID" of "5", and "23 (J)" is set in the "power value" of the information having an "information ID" of "6". Therefore, the power estimation unit 123 calculates "15 (J)" as the amount of change in the information set in the "power value".

Next, the power estimation unit 123 acquires the sum total of the values set in the "power distributed index value" of the acquired sampling information 132 from the previous change in the value set in the "power value" of the acquired sampling information 132, until the current change therein (S72).

More specifically, in the example illustrated in FIG. 27, the power estimation unit 123 identifies information having an "information ID" from "2" to "6" as the acquired sampling information 132 from the previous change in the value set in the "power value" of the acquired sampling information 132 until the current value therein. Thereupon, the power estimation unit 123 calculates "1000" as the sum total of the values set in the "power distributed index value" of the information having "information ID" from "2" to "6" (S72).

Next, the power estimation unit 123 identifies the first information among the information of which the value set for the "distributed value" has not been updated, in the acquired sampling information 132 from the previous change in the value set for the "power value" until the current change therein. The power estimation unit 123 then multiples the value calculated in S71 by the information set in the "power distributed index value" of the identified information, and divides same by the value calculated in S72 (S73).

More specifically, in the example illustrated in FIG. 27, the power estimation unit 123 multiples "15 (J)", which is the value calculated in S71, by "100", which is the "power distributed index value" of the information having an "information ID" of "2", and divides by "1000", which is the value calculated in S72, to acquire a result of "1.5 (J)".

Thereupon, the power estimation unit 123 sets the value calculated in S73, as the "distributed value" of the information identified in S73 (S74). More specifically, as indicated by the underlined portion in FIG. 28, the power estimation unit 123 sets "1.5 (J)" as the "distributed value" of the information having an "information ID" of "2".

When the information set in the "distributed value" of the acquired sampling information 132 acquired from the previous change in the value set in the "power value" until the current change therein has all been updated (YES in S75), then the power estimation unit 123 terminates the process in S25. On the other hand, if all of the information set in the "distributed value" has not been updated (NO in S75), then the process from S73 onwards is repeated. Consequently, as indicated by the underlined portions in FIG. 29, the power estimation unit 123 is able to update the information set in the "power value" of the acquired sampling information 132 acquired from the previous change in the value set in the "power value" until the current change therein.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
   a memory to store a power consumption amount for each first time interval output at each first time interval and an occurrence time of a first event which occurs during the first time interval, the first event indicating execution of a program whose execution time is shorter than the first time interval; and
   a power estimation processor configured to distribute the power consumption amount for each first time interval to each second time interval, which is a time interval shorter than the first time interval, and calculate a value distributed to the second time interval that includes the occurrence time of the first event as a power consumption amount in the event of execution of the program.

2. The information processing device according to claim 1, wherein the power estimation processor distributes a sum of power consumption amounts for each of a plurality of consecutive first time intervals, to each second time interval, which is a time interval shorter than the first time interval, and calculates, as the power consumption amount in the event of the occurrence of the first event, a value distributed to the second time interval that includes the occurrence time of the first event.

3. The information processing device according to claim 2, wherein the power estimation processor multiplies the power consumption amount for each of the plurality of consecutive first time intervals, respectively, by a prescribed weighting value, sums the multiplied values, and distributes the summed value to each of the second time intervals.

4. The information processing device according to claim 1, wherein the power estimation processor:
   acquires a number of occurrence of a second event for each second time interval output at each second time interval; and
   distributes the power consumption amount for each first time interval to each second time interval in such a manner that a ratio of the power consumption amount distributed to each second time interval is equal to a ratio of the number of occurrence of the second event.

5. The information processing device according to claim 1, further comprising:
   a notification processor configured to issue a notification at each first time interval; and
   an information acquisition processor configured to, in accordance with reception of the notification, acquire the power consumption amount for each first time interval and the occurrence time of the first event which occurs during the first time interval.

6. The information processing device according to claim 1, wherein the first event is execution of a program or a function included in a program.

7. The information processing device according to claim 3, wherein the second event is an occurrence of a cache miss in memory access to a cache memory.

8. A non-transitory computer-readable storage medium storing therein a power estimation program for causing a computer to execute a process comprising:

acquiring a power consumption amount for each first time interval output at each first time interval in a storage and an occurrence time of a first event which occurs during the first time interval in a storage, the first event indicating execution of a program whose execution time is shorter than the first time interval;

distributing the power consumption amount for each first time interval to each second time interval, which is a time interval shorter than the first time interval; and calculating a value distributed to the second time interval that includes the occurrence time of the first event as a power consumption amount in the event of execution of the program.

9. A power estimation method, comprising:

acquiring, by a processor, a power consumption amount for each first time interval output at each first time interval in a storage and an occurrence time of a first event which occurs during the first time interval in a storage, the first event indicating execution of a program whose execution time is shorter than the first time interval;

distributing, by a processor, the power consumption amount for each first time interval to each second time interval, which is a time interval shorter than the first time interval; and calculating, by a processor, a value distributed to the second time interval that includes the occurrence time of the first event as a power consumption amount in the event of execution of the program.

\* \* \* \* \*